(12) United States Patent
Novak et al.

(10) Patent No.: US 7,965,376 B2
(45) Date of Patent: *Jun. 21, 2011

(54) ENVIRONMENTAL SYSTEM INCLUDING A TRANSPORT REGION FOR AN IMMERSION LITHOGRAPHY APPARATUS

(75) Inventors: W. Thomas Novak, Hillsborough, CA (US); Andrew J. Hazelton, Tokyo (JP); Douglas C. Watson, Campbell, CA (US)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/819,691

(22) Filed: Jun. 28, 2007

(65) Prior Publication Data

US 2007/0258062 A1  Nov. 8, 2007

Related U.S. Application Data

(60) Division of application No. 11/236,713, filed on Sep. 28, 2005, now Pat. No. 7,251,017, which is a continuation of application No. PCT/US2004/009994, filed on Apr. 1, 2004.

(60) Provisional application No. 60/462,112, filed on Apr. 10, 2003, provisional application No. 60/485,033, filed on Jul. 2, 2003.

(51) Int. Cl.
*G03B 27/42* (2006.01)
*G03B 27/32* (2006.01)
*G03B 27/52* (2006.01)

(52) U.S. Cl. ............................. 355/53; 355/30; 355/77

(58) Field of Classification Search .................... 355/30, 355/53, 67, 77; 134/94

See application file for complete search history.

(56) References Cited

U.S. PATENT DOCUMENTS

| | | | |
|---|---|---|---|
| 3,648,587 | A | 3/1972 | Stevens |
| 4,346,164 | A | 8/1982 | Tabarelli et al. |
| 4,441,808 | A | 4/1984 | Giacomelli |
| 4,480,910 | A | 11/1984 | Takanashi et al. |
| 4,509,852 | A | 4/1985 | Tabarelli et al. |
| 5,528,100 | A | 6/1996 | Igeta et al. |
| 5,528,118 | A | 6/1996 | Lee |
| 5,610,683 | A | 3/1997 | Takahashi |

(Continued)

FOREIGN PATENT DOCUMENTS

CN  1573571 A  2/2005

(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

(Continued)

*Primary Examiner* — Hung Henry Nguyen
*Assistant Examiner* — Steven H Whitesell-Gordon
(74) *Attorney, Agent, or Firm* — Oliff & Berridge, PLC

(57) ABSTRACT

A lithographic projection apparatus that is arranged to project a pattern from a patterning device onto a substrate using a projection system has a liquid supply system arranged to supply a liquid to a space between the projection system and the substrate. The apparatus also includes a liquid collecting system that includes a liquid collection member having a permeable member through which a liquid is collected from a surface of an object opposite to the liquid collection member, wherein the permeable member has a plurality of passages that generate a capillary force.

23 Claims, 13 Drawing Sheets

U.S. PATENT DOCUMENTS

| | | | |
|---|---|---|---|
| 5,623,853 | A | 4/1997 | Novak et al. |
| 5,668,672 | A | 9/1997 | Oomura |
| 5,689,377 | A | 11/1997 | Takahashi |
| 5,715,039 | A | 2/1998 | Fukuda et al. |
| 5,825,043 | A | 10/1998 | Suwa |
| 5,835,275 | A | 11/1998 | Takahashi et al. |
| 5,874,820 | A | 2/1999 | Lee |
| 5,969,441 | A | 10/1999 | Loopstra et al. |
| 5,997,963 | A | 12/1999 | Davison et al. |
| 6,191,429 | B1 | 2/2001 | Suwa |
| 6,236,634 | B1 | 5/2001 | Lee et al. |
| 6,262,796 | B1 | 7/2001 | Loopstra et al. |
| 6,310,680 | B1 * | 10/2001 | Taniguchi .................. 355/53 |
| 6,391,503 | B2 | 5/2002 | Ebihara |
| 6,400,441 | B1 | 6/2002 | Nishi et al. |
| 6,417,914 | B1 | 7/2002 | Li |
| 6,438,074 | B1 * | 8/2002 | Aki et al. .................. 369/16 |
| 6,488,040 | B1 * | 12/2002 | de Larios et al. ............ 134/95.2 |
| 6,778,257 | B2 | 8/2004 | Bleeker et al. |
| 6,781,670 | B2 | 8/2004 | Krautschik |
| 6,788,477 | B2 | 9/2004 | Lin |
| 6,867,844 | B2 | 3/2005 | Vogel et al. |
| 6,952,253 | B2 | 10/2005 | Lof et al. |
| 6,988,327 | B2 | 1/2006 | Garcia et al. |
| 7,053,983 | B2 | 5/2006 | Tokita |
| 7,057,702 | B2 | 6/2006 | Lof et al. |
| 7,251,017 | B2 | 7/2007 | Novak et al. |
| 7,268,854 | B2 | 9/2007 | Nagasaka |
| 7,321,415 | B2 | 1/2008 | Hazelton et al. |
| 7,321,419 | B2 | 1/2008 | Ebihara |
| 7,345,742 | B2 | 3/2008 | Novak et al. |
| 7,352,434 | B2 | 4/2008 | Streefkerk et al. |
| 7,355,676 | B2 | 4/2008 | Sogard |
| 7,369,217 | B2 | 5/2008 | Carroll |
| 7,388,648 | B2 | 6/2008 | Lof et al. |
| 7,399,979 | B2 | 7/2008 | Nagasaka |
| 7,436,486 | B2 | 10/2008 | Hirukawa |
| 7,446,851 | B2 | 11/2008 | Hirukawa |
| 7,453,550 | B2 | 11/2008 | Nagasaka et al. |
| 7,456,930 | B2 | 11/2008 | Hazelton et al. |
| 7,471,371 | B2 | 12/2008 | Kameyama |
| 7,486,385 | B2 | 2/2009 | Ebihara |
| 7,495,744 | B2 | 2/2009 | Nagaksaka |
| 7,505,111 | B2 | 3/2009 | Hirukawa et al. |
| 7,535,550 | B2 | 5/2009 | Nagasaka |
| 7,542,128 | B2 | 6/2009 | Nagasaka et al. |
| 7,589,821 | B2 | 9/2009 | Hirukawa |
| 7,639,343 | B2 | 12/2009 | Hirukawa |
| 7,671,963 | B2 | 3/2010 | Streefkerk et al. |
| 2002/0020821 | A1 | 2/2002 | Van Santen et al. |
| 2002/0163629 | A1 | 11/2002 | Switkes et al. |
| 2003/0030916 | A1 | 2/2003 | Suenaga |
| 2003/0174408 | A1 | 9/2003 | Rostalski et al. |
| 2004/0000627 | A1 | 1/2004 | Schuster |
| 2004/0075895 | A1 | 4/2004 | Lin |
| 2004/0109237 | A1 | 6/2004 | Epple et al. |
| 2004/0114117 | A1 | 6/2004 | Bleeker |
| 2004/0118184 | A1 | 6/2004 | Violette |
| 2004/0119954 | A1 | 6/2004 | Kawashima et al. |
| 2004/0125351 | A1 | 7/2004 | Krautschik |
| 2004/0136494 | A1 | 7/2004 | Lof et al. |
| 2004/0160582 | A1 | 8/2004 | Lof et al. |
| 2004/0165159 | A1 | 8/2004 | Lof et al. |
| 2004/0169834 | A1 | 9/2004 | Richter et al. |
| 2004/0169924 | A1 | 9/2004 | Flagello et al. |
| 2004/0180294 | A1 | 9/2004 | Baba-Ali et al. |
| 2004/0180299 | A1 | 9/2004 | Rolland et al. |
| 2004/0207824 | A1 | 10/2004 | Lof et al. |
| 2004/0211920 | A1 | 10/2004 | Derksen et al. |
| 2004/0224265 | A1 | 11/2004 | Endo et al. |
| 2004/0224525 | A1 | 11/2004 | Endo et al. |
| 2004/0227923 | A1 | 11/2004 | Flagello et al. |
| 2004/0253547 | A1 | 12/2004 | Endo et al. |
| 2004/0253548 | A1 | 12/2004 | Endo et al. |
| 2004/0257544 | A1 | 12/2004 | Vogel et al. |
| 2004/0259008 | A1 | 12/2004 | Endo et al. |
| 2004/0259040 | A1 | 12/2004 | Endo et al. |
| 2004/0263808 | A1 | 12/2004 | Sewell |
| 2004/0263809 | A1 | 12/2004 | Nakano |
| 2005/0007569 | A1 | 1/2005 | Streefkerk et al. |
| 2005/0030506 | A1 | 2/2005 | Schuster |
| 2005/0036121 | A1 | 2/2005 | Hoogendam et al. |
| 2005/0036183 | A1 | 2/2005 | Yeo et al. |
| 2005/0036184 | A1 | 2/2005 | Yeo et al. |
| 2005/0036213 | A1 | 2/2005 | Mann et al. |
| 2005/0037269 | A1 | 2/2005 | Levinson |
| 2005/0042554 | A1 | 2/2005 | Dierichs et al. |
| 2005/0046934 | A1 | 3/2005 | Ho et al. |
| 2005/0048223 | A1 | 3/2005 | Pawloski et al. |
| 2005/0068499 | A1 | 3/2005 | Dodoc et al. |
| 2005/0068639 | A1 | 3/2005 | Pierrat et al. |
| 2005/0073670 | A1 | 4/2005 | Carroll |
| 2005/0084794 | A1 | 4/2005 | Meagley et al. |
| 2005/0088635 | A1 | 4/2005 | Hoogendam et al. |
| 2005/0094116 | A1 | 5/2005 | Flagello et al. |
| 2005/0100745 | A1 | 5/2005 | Lin et al. |
| 2005/0110973 | A1 | 5/2005 | Streefkerk et al. |
| 2005/0117224 | A1 | 6/2005 | Shafer et al. |
| 2005/0122497 | A1 | 6/2005 | Lyons et al. |
| 2005/0132914 | A1 | 6/2005 | Mulkens et al. |
| 2005/0134815 | A1 | 6/2005 | Van Santen et al. |
| 2005/0141098 | A1 | 6/2005 | Schuster |
| 2005/0145265 | A1 | 7/2005 | Ravkin et al. |
| 2005/0145803 | A1 | 7/2005 | Hakey et al. |
| 2005/0146694 | A1 | 7/2005 | Tokita |
| 2005/0146695 | A1 | 7/2005 | Kawakami |
| 2005/0147920 | A1 | 7/2005 | Lin et al. |
| 2005/0153424 | A1 | 7/2005 | Coon |
| 2005/0158673 | A1 | 7/2005 | Hakey et al. |
| 2005/0164502 | A1 | 7/2005 | Deng et al. |
| 2005/0174549 | A1 | 8/2005 | Duineveld et al. |
| 2005/0175940 | A1 | 8/2005 | Dierichs |
| 2005/0185269 | A1 | 8/2005 | Epple et al. |
| 2005/0190435 | A1 | 9/2005 | Shafer et al. |
| 2005/0190455 | A1 | 9/2005 | Rostalski et al. |
| 2005/0205108 | A1 | 9/2005 | Chang et al. |
| 2005/0213061 | A1 | 9/2005 | Hakey et al. |
| 2005/0213072 | A1 | 9/2005 | Schenker et al. |
| 2005/0217135 | A1 | 10/2005 | O'Donnell et al. |
| 2005/0217137 | A1 | 10/2005 | Smith et al. |
| 2005/0217703 | A1 | 10/2005 | O'Donnell |
| 2005/0219481 | A1 | 10/2005 | Cox et al. |
| 2005/0219482 | A1 | 10/2005 | Baselmans et al. |
| 2005/0219499 | A1 | 10/2005 | Maria Zaal et al. |
| 2005/0225737 | A1 | 10/2005 | Weissenrieder et al. |
| 2005/0233081 | A1 | 10/2005 | Tokita |
| 2005/0253090 | A1 | 11/2005 | Gau et al. |
| 2005/0259233 | A1 | 11/2005 | Streefkerk et al. |
| 2005/0259234 | A1 | 11/2005 | Hirukawa et al. |
| 2005/0264778 | A1 | 12/2005 | Lof et al. |
| 2005/0270505 | A1 | 12/2005 | Smith |
| 2005/0270506 | A1 | 12/2005 | Streefkerk et al. |
| 2005/0280791 | A1 | 12/2005 | Nagasaka et al. |
| 2005/0286032 | A1 | 12/2005 | Lof et al. |
| 2006/0005860 | A1 | 1/2006 | Garcia |
| 2006/0012765 | A1 | 1/2006 | Kameyama |
| 2006/0023182 | A1 | 2/2006 | Novak et al. |
| 2006/0023184 | A1 | 2/2006 | Coon et al. |
| 2006/0023189 | A1 | 2/2006 | Lof et al. |
| 2006/0038968 | A1 | 2/2006 | Kemper et al. |
| 2006/0066828 | A1 | 3/2006 | Klerk |
| 2006/0087630 | A1 | 4/2006 | Kemper et al. |
| 2006/0098177 | A1 | 5/2006 | Nagasaka |
| 2006/0114445 | A1 | 6/2006 | Ebihara |
| 2006/0119807 | A1 | 6/2006 | Baselmans et al. |
| 2006/0132739 | A1 | 6/2006 | Ebihara |
| 2006/0132740 | A1 | 6/2006 | Ebihara |
| 2006/0139613 | A1 | 6/2006 | Houkes et al. |
| 2006/0146306 | A1 | 7/2006 | Nagasaka et al. |
| 2006/0164615 | A1 | 7/2006 | Hirukawa |
| 2006/0268249 | A1 | 11/2006 | Kameyama |
| 2006/0274293 | A1 | 12/2006 | Nagasaka et al. |
| 2007/0109516 | A1 | 5/2007 | Kameyama |
| 2007/0211234 | A1 | 9/2007 | Ebihara |
| 2007/0258064 | A1 | 11/2007 | Hirukawa |
| 2007/0258065 | A1 | 11/2007 | Nagasaka et al. |
| 2007/0263183 | A1 | 11/2007 | Nagasaka et al. |

| | | | |
|---|---|---|---|
| 2007/0263185 A1 | 11/2007 | Nagasaka et al. | |
| 2008/0002166 A1 | 1/2008 | Ebihara | |
| 2008/0030697 A1 | 2/2008 | Kameyama | |
| 2008/0151203 A1 | 6/2008 | Hirukawa et al. | |
| 2008/0297746 A1 | 12/2008 | Nagasaka | |
| 2009/0009745 A1 | 1/2009 | Nagasaka | |
| 2009/0015807 A1 | 1/2009 | Hirukawa et al. | |
| 2009/0190112 A1 | 7/2009 | Ebihara | |

FOREIGN PATENT DOCUMENTS

| | | |
|---|---|---|
| DE | 221 563 A1 | 4/1985 |
| DE | 224 448 A1 | 7/1985 |
| EP | 0 312 066 A2 | 4/1989 |
| EP | 1 052 552 A2 | 11/2000 |
| EP | 1 420 298 A2 | 5/2004 |
| EP | 1 420 299 A2 | 5/2004 |
| EP | 1 420 300 A2 | 5/2004 |
| EP | 1 477 856 A1 | 11/2004 |
| EP | 1 571 695 A1 | 9/2005 |
| EP | 1 571 697 A1 | 9/2005 |
| EP | 1 571 698 A1 | 9/2005 |
| EP | 1 612 850 A1 | 1/2006 |
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-4-305915 | 10/1992 |
| JP | A-4-305917 | 10/1992 |
| JP | A-5-62877 | 3/1993 |
| JP | A-6-53120 | 2/1994 |
| JP | A-6-124873 | 5/1994 |
| JP | A-6-188169 | 7/1994 |
| JP | A-7-220990 | 8/1995 |
| JP | A-08-136475 | 5/1996 |
| JP | A-8-136475 | 5/1996 |
| JP | A-8-166475 | 6/1996 |
| JP | A-08-166475 | 6/1996 |
| JP | A-08-171054 | 7/1996 |
| JP | A-8-171054 | 7/1996 |
| JP | A-8-316125 | 11/1996 |
| JP | A-08-330224 | 12/1996 |
| JP | A-8-330224 | 12/1996 |
| JP | A-8-334695 | 12/1996 |
| JP | A-08-334695 | 12/1996 |
| JP | A-10-003039 | 1/1998 |
| JP | A-10-3039 | 1/1998 |
| JP | A-10-020195 | 1/1998 |
| JP | A-10-20195 | 1/1998 |
| JP | A-10-163099 | 6/1998 |
| JP | A-10-214783 | 8/1998 |
| JP | A-10-255319 | 9/1998 |
| JP | A-10-303114 | 11/1998 |
| JP | A-10-340846 | 12/1998 |
| JP | A-11-135400 | 5/1999 |
| JP | A-11-176727 | 7/1999 |
| JP | 11-260791 * | 9/1999 |
| JP | A-11-260791 | 9/1999 |
| JP | A-2000-58436 | 2/2000 |
| JP | A-2000-505958 | 5/2000 |
| JP | A-2004-165666 | 6/2004 |
| JP | A-2004-289126 | 10/2004 |
| JP | A-2007-289127 | 10/2004 |
| JP | A-2004-343114 | 12/2004 |
| JP | A-2004-349645 | 12/2004 |
| JP | A-2005-109426 | 4/2005 |
| JP | A-2005-109488 | 4/2005 |
| JP | A-2005-116571 | 4/2005 |
| JP | A-2005-129914 | 5/2005 |
| JP | A-2005-159322 | 6/2005 |
| JP | A-2005-183744 | 7/2005 |
| WO | WO 98/28665 | 7/1998 |
| WO | WO 99/49504 | 9/1999 |
| WO | WO 01/35168 | 5/2001 |
| WO | WO 02/091078 A1 | 11/2002 |
| WO | WO 03/077037 A1 | 9/2003 |
| WO | WO 2004/019128 A2 | 3/2004 |
| WO | WO 2004/032160 A2 | 4/2004 |
| WO | WO 2004/107048 A2 | 5/2004 |
| WO | WO 2004/053935 A2 | 6/2004 |
| WO | WO 2004/053955 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/086468 A1 | 10/2004 |
| WO | WO 2004/086470 A1 | 10/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2004/105106 A1 | 12/2004 |
| WO | WO 2004/114380 A1 | 12/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2006/007111 A2 | 1/2006 |
| WO | WO 2006/009573 A1 | 1/2006 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, 3rd 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages (slides 1-24).

Optical Microlithography XVI, Proceedings of SPIE vol. 5040 (2003), "Immersion lithography; its potential performance and issues", Soichi Owa et al., pp. 724-733.

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages (slides 1-51).

Nikon Corporation, NGL Workshop, Jul. 10, 2003, :Potential performance and feasibility of immersion lithography, Soichi Owa et al., 33 pages, slides 1-33.

Oct. 1, 2008 Supplementary European Search Report for EP 04 75 8599.
Nov. 30, 2006 International Search Report and Written Opinion for PCT/IB04/02704.
Nov. 7, 2006 Australian Search Report and Written Opinion for Singapore Patent Application No. 200506412-6.
Jan. 25, 2006 Office Action in U.S. Appl. No. 11/237,799.
Oct. 18, 2006 Notice of Allowance in U.S. Appl. No. 11/237,799.
Apr. 10, 2007 Notice of Allowance in U.S. Appl. No. 11/237,799.
Aug. 29, 2007 Notice of Allowance in U.S. Appl. No. 11/237,799.
Aug. 1, 2006 Office Action in U.S. Appl. No. 11/253,597.
Mar. 23, 2007 Notice of Allowance in U.S. Appl. No. 11/253,597.
Apr. 4, 2006 Office Action in U.S. Appl. No. 11/329,269.
Dec. 7, 2006 Notice of Allowance in U.S. Appl. No. 11/329,269.
May 29, 2007 Notice of Allowance in U.S. Appl. No. 11/329,269.
Nov. 14, 2007 Notice of Allowance in U.S. Appl. No. 11/329,269.
Jun. 16, 2009 Office Action in U.S. Appl. No. 11/701,378.
Jan. 8, 2009 Office Action in U.S. Appl. No. 11/701,378.
Apr. 17, 2008 Office Action in U.S. Appl. No. 11/701,378.
Oct. 16, 2007 Office Action in U.S. Appl. No. 11/819,089.
Jul. 25, 2008 Notice of Allowance in U.S. Appl. No. 11/819,089.
Jul. 24, 2007 Office Action in U.S. Appl. No. 11/705,001.
Oct. 30, 2007 Notice of Allowance in U.S. Appl. No. 11/705,001.
Feb. 1, 2006 Office Action in U.S. Appl. No. 11/236,713.
Mar. 23, 2007 Notice of Allowance in U.S. Appl. No. 11/236,713.
Oct. 16, 2008 Office Action in U.S. Appl. No. 11/819,689.
Jul. 9, 2009 Office Action in U.S. Appl. No. 11/819,689.
Oct. 16, 2008 Office Action in U.S. Appl. No. 11/819,447.
Jul. 9, 2009 Office Action in U.S. Appl. No. 11/819,447.
Oct. 17, 2008 Office Action in U.S. Appl. No. 11/819,446.
Jul. 9, 2009 Office Action in U.S. Appl. No. 11/819,446.
Hiroaki Kawata et al; "Optical Projection Lithography Using lenses with Numerical Apertures Greater Than Unity"; *Microelectronic Engineering*; vol. 9; 1989; pp. 31-36.
Hiroaki Kawata et al; "Fabrication of 0.2 μm Fine Patterns Using Optical Projection Lithography with an Oil Immersion Lens"; *Jpn. J. Appl. Phys.*; vol. 31, Part I, No. 128; Dec. 1992; pp. 4174-4177.
G. Owen et al.; "⅛ μM Optical Lithography"; *J. Vac. Sci. Technol. B.*; vol. 10, No. 6; Nov./Dec. 1992; pp. 3032-3036.
Willi Ulrich et al.; "The Development of Dioptric Projection Lenses for DUV Lithography"; Proceedings of *SPIE*; vol. 4832; 2002; pp. 158-169.
Bruce W. Smith et al.; "Water Immersion Optical Lithography for the 45nm Node"; Optical Microlithography XVI; *Proceedings of SPIE*; vol. 5040; 2003; pp. 679-689.
Scott Hafeman et al.; "Simulation of Imaging and Stray Light Effects in Immersion Lithography"; Optical Microlithography XVI; *Proceedings of SPIE*; vol. 5040; 2003; pp. 700-712.
So-Yeon Baek et al.; "Simulation Study of Process Latitude for Liquid Immersion Lithography"; Optical Microlithography XVI; *Proceedings of SPIE*; vol. 5040; 2003; pp. 1620-1630.
Mark D. Feur et al.; "Projection Photolithography-Liftoff Techniques for Production of 0.2-μm Metal Patterns"; *IEEE Transactions on Electron Devices*; vol. 28, No. 11; Nov. 1981; pp. 1375-1378.
Aug. 22, 2008 Office Action in Chinese Application No. 200480009673.8 (with translation).
May 8, 2009 Office Action in Chinese Application No. 200480009673.8 (with translation).
Apr. 15, 2010 Office Action issued in U.S. Appl. No. 11/819,446.
Apr. 15, 2010 Office Action issued in U.S. Appl. No. 11/819,447.
May 3, 2010 Notice of Allowance issued in U.S. Appl. No. 11/819,689.
Nov. 16, 2010 Notice of Allowance in Japanese Application No. 2006-509568 with translation.
Nov. 16, 2010 Office Action in Japanese Application No. 2006-506634 with translation.
Dec. 13, 2010 Notice of Allowance in U.S. Appl. No. 11/819,446.
Dec. 13, 2010 Notice of Allowance in U.S. Appl. No. 11/819,447.
Dec. 21, 2010 Notice of Allowance in U.S. Appl. No. 11/635,607.
Dec. 23, 2010 Notice of Allowance in U.S. Appl. No. 10/593,802.
M. Switkes et al., "Resolution Enhancement of 157 nm Lithography by Liquid Immersion"; J. Microlith., Microfab. Microsyst., vol. 1, No. 3; Oct. 2002; pp. 225-228.
Dec. 8, 2009 Office Action in Japanese Application No. 2006-506634, (with translation).
Nov. 21, 2008 Office Action in Chinese Application No. 200480009675.7, (with translation).
Oct. 9, 2009 Office Action in Chinese Application No. 200480009675.7, (with translation).
Dec. 20, 2006 Australian Invitation to Respond to Written Opinion in Singapore Application No. 200506412-6.
Aug. 17, 2007 Australian Examination Report in Singapore Application No. 200506412-6.
Nov. 2, 2006 Supplementary Notice of Allowance in U.S. Appl. No. 11/237,799.
Mar. 24, 2009 Advisory Action in U.S. Appl. No. 11/701,378.
Mar. 23, 2010 Notice of Allowance in U.S. Appl. No. 11/701,378.
Mar. 31, 2010 Supplementary Notice of Allowance in U.S. Appl. No. 11/701,378.
Dec. 8, 2009 Office Action in Japanese Application No. 2006-509568, (with translation).
Nov. 20, 2009 Notice of Allowance in Chinese Application No. 200480009673.8, (with translation).
Sep. 23, 2008 Supplemental European Search Report in European Application No. 04759085.6.
Oct. 13, 2005 International Search Report and Written Opinion in Application No. PCT/US04/09994.
Feb. 2, 2010 Office Action in Japanese Application No. 2006-511475, (with translation).
May 11, 2010 Notice of Allowance in Japanese Application No. 2006-511475, (with translation).
Apr. 1, 2009 Office Action in U.S. Appl. No. 10/593,802.
Nov. 27, 2009 Notice of Allowance in U.S. Appl. No. 10/593,802.
Mar. 25, 2010 Notice of Allowance in U.S. Appl. No. 10/593,802.
Dec. 19, 2008 Office Action in U.S. Appl. No. 11/635,607.
Aug. 28, 2009 Office Action in U.S. Appl. No. 11/635,607.
Aug. 9, 2005 International Search Report and Written Opinion in Application No. PCT/JP2005/005254, (with translation).
Feb. 27, 2007 Office Action in U.S. Appl. No. 11/239,493.
Jun. 27, 2007 Notice of Allowance in U.S. Appl. No. 11/239,493.
Feb. 15, 2008 Notice of Allowance in U.S. Appl. No. 11/239,493.
Notice of Allowance issued in U.S. Appl. No. 11/635,607 mailed Nov. 10, 2010.
Notice of Allowance for U.S. U.S. Appl. No. 10/593,802; mailed Sep. 3, 2010.
Notice of Allowance in U.S. Appl. No. 11/701,378; mailed Jul. 14, 2010.
Office Action issued in Chinese Application No. CN200480009675.7; mailed Jul. 26, 2010 (with translation).
Jan. 12, 2011 Office Action issued in Chinese Patent Application No. 201010113626.5 (with translation).
Jan. 14, 2011 Office Action issued in Korean Patent Application No. 2005-7019303 (with translation).
Jan. 14, 2011 Office Action issued in Korean Patent Application No. 2005-7019305 (with translation).
Jan. 3, 2011 Search and Examination Report for Singaporean Patent Application No. 200800250-3.
Jan. 13, 2011 Search and Examination Report for Singaporean Patent Application No. 200800251-1.
Feb. 22, 2011 Office Action issued in Japanese Patent Application No. 2006-506634 (with translation).
Mar. 31, 2011 Office Action issued in Chinese Patent Application No. 200480009675.7 (with translation).

* cited by examiner

ENVIRONMENTAL SYSTEM INCLUDING A TRANSPORT REGION FOR AN IMMERSION LITHOGRAPHY APPARATUS

RELATED APPLICATIONS

This is a Divisional of U.S. patent application Ser. No. 11/236,713 filed Sep. 28, 2005, which is a Continuation of International Application No. PCT/US2004/009994 filed Apr. 1, 2004, which claims the benefit of U.S. Provisional Patent Application No. 60/462,112 filed on Apr. 10, 2003 and U.S. Provisional Patent Application No. 60/485,033 filed on Jul. 2, 2003. The disclosures of these applications are incorporated herein by reference in their entireties.

BACKGROUND

Exposure apparatus are commonly used to transfer images from a reticle onto a semiconductor wafer during semiconductor processing. A typical exposure apparatus includes an illumination source, a reticle stage assembly that positions a reticle, an optical assembly, a wafer stage assembly that positions a semiconductor wafer, and a measurement system that precisely monitors the position of the reticle and the wafer.

Immersion lithography systems utilize a layer of immersion fluid that fills a gap between the optical assembly and the wafer. The wafer is moved rapidly in a typical lithography system and it would be expected to carry the immersion fluid away from the gap. This immersion fluid that escapes from the gap can interfere with the operation of other components of the lithography system. For example, the immersion fluid can interfere with the measurement system that monitors the position of the wafer.

SUMMARY

The invention is directed to an environmental system for controlling an environment in a gap between an optical assembly and a device that is retained by a device stage. The environmental system includes an immersion fluid source and a transport region that is positioned near the device. The immersion fluid source delivers an immersion fluid that enters the gap. The transport region captures immersion fluid that is exiting the gap. With this design, in certain embodiments, the invention avoids the use of direct vacuum suction on the device that could potentially distort the device and/or the optical assembly.

In one embodiment, the environmental system includes a fluid barrier that is positioned near the device and that encircles the gap. Furthermore, the fluid barrier can maintain the transport region near the device.

In one embodiment, the environmental system includes a fluid removal system that removes immersion fluid from near the transport region. In another embodiment, the fluid removal system can direct a removal fluid that removes immersion fluid from the transport region. In this embodiment, the removal fluid can be at a removal fluid temperature that is higher than an immersion fluid temperature of the immersion fluid.

In one embodiment, the transport region is a substrate that includes a plurality of passages for collecting the immersion fluid near the transport region. As an example, the transport region can be made of a material that conveys the immersion fluid by capillary action. In this embodiment, the passages can be a plurality of pores. In an alternative embodiment, the passages can be a plurality of spaced apart transport apertures that extend through the transport region.

The present invention also is directed to an exposure apparatus, a wafer, a device, a method for controlling an environment in a gap, a method for making an exposure apparatus, a method for making a device, and a method for manufacturing a wafer.

BRIEF DESCRIPTION OF THE DRAWINGS

The invention will be described in conjunction with exemplary embodiments in which like reference numerals designate like elements, and in which.

DETAILED DESCRIPTION OF EMBODIMENTS

Figure 1:
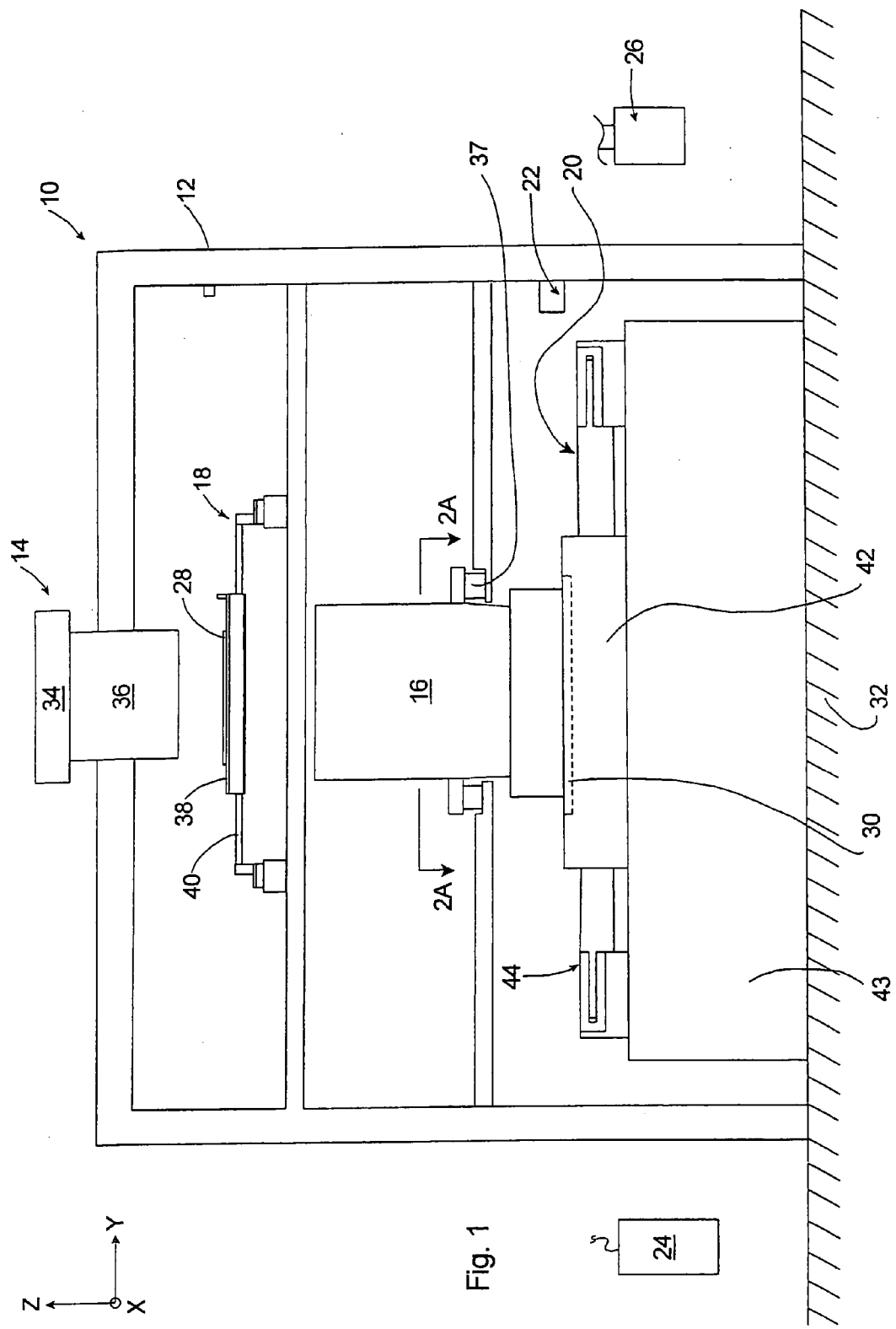
FIG. 1 is a side illustration of an exposure apparatus having features of the invention.

FIG. 1 is a schematic illustration of a precision assembly, namely an exposure apparatus 10 having features of the invention. The exposure apparatus 10 includes an apparatus frame 12, an illumination system 14 (irradiation apparatus), an optical assembly 16, a reticle stage assembly 18, a device stage assembly 20, a measurement system 22, a control system 24, and a fluid environmental system 26. The design of the components of the exposure apparatus 10 can be varied to suit the design requirements of the exposure apparatus 10.

A number of Figures include an orientation system that illustrates an X axis, a Y axis that is orthogonal to the X axis, and a Z axis that is orthogonal to the X and Y axes. It should be noted that these axes also can be referred to as the first, second and third axes.

The exposure apparatus 10 is particularly useful as a lithographic device that transfers a pattern (not shown) of an integrated circuit from a reticle 28 onto a semiconductor wafer 30 (illustrated in phantom). The wafer 30 is also referred to generally as a device, or work piece. The exposure apparatus 10 mounts to a mounting base 32, e.g., the ground, a base, or floor or some other supporting structure.

There are a number of different types of lithographic devices. For example, the exposure apparatus 10 can be used as a scanning type photolithography system that exposes the pattern from the reticle 28 onto the wafer 30 with the reticle 28 and the wafer 30 moving synchronously. In a scanning type lithographic apparatus, the reticle 28 is moved perpendicularly to an optical axis of the optical assembly 16 by the reticle stage assembly 18 and the wafer 30 is moved perpendicularly to the optical axis of the optical assembly 16 by the wafer stage assembly 20. Irradiation of the reticle 28 and exposure of the wafer 30 occur while the reticle 28 and the wafer 30 are moving synchronously.

Alternatively, the exposure apparatus 10 can be a step-and-repeat type photolithography system that exposes the reticle 28 while the reticle 28 and the wafer 30 are stationary. In the step and repeat process, the wafer 30 is in a constant position relative to the reticle 28 and the optical assembly 16 during the exposure of an individual field. Subsequently, between consecutive exposure steps, the wafer 30 is consecutively moved with the wafer stage assembly 20 perpendicularly to the optical axis of the optical assembly 16 so that the next field of the wafer 30 is brought into position relative to the optical assembly 16 and the reticle 28 for exposure. Following this process, the images on the reticle 28 are sequentially exposed onto the fields of the wafer 30, and then the next field of the wafer 30 is brought into position relative to the optical assembly 16 and the reticle 28.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head.

The apparatus frame 12 supports the components of the exposure apparatus 10. The apparatus frame 12 illustrated in FIG. 1 supports the reticle stage assembly 18, the wafer stage assembly 20, the optical assembly 16 and the illumination system 14 above the mounting base 32.

The illumination system 14 includes an illumination source 34 and an illumination optical assembly 36. The illumination source 34 emits a beam (irradiation) of light energy. The illumination optical assembly 36 guides the beam of light energy from the illumination source 34 to the optical assembly 16. The beam illuminates selectively different portions of the reticle 28 and exposes the wafer 30. In FIG. 1, the illumination source 34 is illustrated as being supported above the reticle stage assembly 18. Typically, however, the illumination source 34 is secured to one of the sides of the apparatus frame 12 and the energy beam from the illumination source 34 is directed to above the reticle stage assembly 18 with the illumination optical assembly 36.

The illumination source 34 can be a g-line source (436 nm), an i-line source (365 nm), a KrF excimer laser (248 nm), an ArF excimer laser (193 nm) or a $F_2$ laser (157 nm). Alternatively, the illumination source 34 can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 28 to the wafer 30. Depending upon the design of the exposure apparatus 10, the optical assembly 16 can magnify or reduce the image illuminated on the reticle 28. The optical assembly 16 need not be limited to a reduction system. It also could be a 1× or magnification system.

When far ultra-violet rays such as the excimer laser is used, glass materials such as quartz and fluorite that transmit far ultra-violet rays can be used in the optical assembly 16. When the $F_2$ type laser or x-ray is used, the optical assembly 16 can be either catadioptric or refractive (a reticle should also preferably be a reflective type), and when an electron beam is used, electron optics can consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include Japanese Laid-Open Patent Application Publication No. 8-171054 and its counterpart U.S. Pat. No. 5,668,672, as well as Japanese Laid-Open Patent Application Publication No. 10-20195 and its counterpart U.S. Pat. No. 5,835,275. In these cases, the reflecting optical device can be a catadioptric optical system incorporating a beam splitter and concave mirror. Japanese Laid-Open Patent Application Publication No. 8-334695 and its counterpart U.S. Pat. No. 5,689,377 as well as Japanese Laid-Open Patent Application Publication No. 10-3039 and its counterpart U.S. Pat. Application No. 873,605 (Application Date: Jun. 12, 1997) also use a reflecting-refracting type of optical system incorporating a concave mirror, etc., but without a beam splitter, and can also be employed with this invention. The disclosures of the above-mentioned U.S. patents and Japanese Laid-Open patent applications publications are incorporated herein by reference in their entireties.

In one embodiment, the optical assembly 16 is secured to the apparatus frame 12 with one or more optical mount isolators 37. The optical mount isolators 37 inhibit vibration of the apparatus frame 12 from causing vibration to the optical assembly 16. Each optical mount isolator 37 can include a pneumatic cylinder (not shown) that isolates vibration and an actuator (not shown) that isolates vibration and controls the position with at least two degrees of motion. Suitable optical mount isolators 37 are sold by Integrated Dynamics Engineering, located in Woburn, Mass. For ease of illustration, two spaced apart optical mount isolators 37 are shown as being used to secure the optical assembly 16 to the apparatus frame 12. However, for example, three spaced apart optical mount isolators 37 can be used to kinematically secure the optical assembly 16 to the apparatus frame 12.

The reticle stage assembly 18 holds and positions the reticle 28 relative to the optical assembly 16 and the wafer 30. In one embodiment, the reticle stage assembly 18 includes a reticle stage 38 that retains the reticle 28 and a reticle stage mover assembly 40 that moves and positions the reticle stage 38 and reticle 28.

Somewhat similarly, the device stage assembly 20 holds and positions the wafer 30 with respect to the projected image of the illuminated portions of the reticle 28. In one embodiment, the device stage assembly 20 includes a device stage 42 that retains the wafer 30, a device stage base 43 that supports and guides the device stage 42, and a device stage mover assembly 44 that moves and positions the device stage 42 and the wafer 30 relative to the optical assembly 16 and the device stage base 43. The device stage 42 is described in more detail below.

Each stage mover assembly 40, 44 can move the respective stage 38, 42 with three degrees of freedom, less than three degrees of freedom, or more than three degrees of freedom. For example, in alternative embodiments, each stage mover assembly 40, 44 can move the respective stage 38, 42 with one, two, three, four, five or six degrees of freedom. The reticle stage mover assembly 40 and the device stage mover assembly 44 can each include one or more movers, such as rotary motors, voice coil motors, linear motors utilizing a Lorentz force to generate drive force, electromagnetic movers, planar motors, or other force movers.

In photolithography systems, when linear motors (see U.S. Pat. Nos. 5,623,853 or 5,528,118) are used in the wafer stage assembly or the reticle stage assembly, the linear motors can be either an air levitation type employing air bearings or a magnetic levitation type using Lorentz force or reactance force. Additionally, the stage could move along a guide, or it could be a guideless type stage that uses no guide. The disclosures of U.S. Pat. Nos. 5,623,853 and 5,528,118 are incorporated herein by reference in their entireties.

Alternatively, one of the stages could be driven by a planar motor that drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage base and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100 and Japanese Laid-Open Patent Application Publication No. 8-136475. Additionally, reaction forces generated by the reticle (mask) stage motion can be mechanically transferred to the floor (ground) by use of a frame member as described in U.S. Pat. No. 5,874,820 and Japanese Laid-Open Patent Application Publication No. 8-330224. The disclosures of U.S. Pat. Nos. 5,528,100 and 5,874,820 and Japanese Laid-Open Patent Application Publication Nos. 8-136475 and 8-330224 are incorporated herein by reference in their entireties.

The measurement system 22 monitors movement of the reticle 28 and the wafer 30 relative to the optical assembly 16 or some other reference. With this information, the control system 24 can control the reticle stage assembly 18 to precisely position the reticle 28 and the device stage assembly 20 to precisely position the wafer 30. The design of the measurement system 22 can vary. For example, the measurement system 22 can utilize multiple laser interferometers, encoders, mirrors, and/or other measuring devices.

The control system 24 receives information from the measurement system 22 and controls the stage mover assemblies 40, 44 to precisely position the reticle 28 and the wafer 30. Additionally, the control system 24 can control the operation of the components of the environmental system 26. The control system 24 can include one or more processors and circuits.

The environmental system 26 controls the environment in a gap 246 (illustrated in FIG. 2B) between the optical assembly 16 and the wafer 30. The gap 246 includes an imaging field. The imaging field includes the area adjacent to the region of the wafer 30 that is being exposed and the area in which the beam of light energy travels between the optical assembly 16 and the wafer 30. With this design, the environmental system 26 can control the environment in the imaging field.

The desired environment created and/or controlled in the gap 246 by the environmental system 26 can vary accordingly to the wafer 30 and the design of the rest of the components of the exposure apparatus 10, including the illumination system 14. For example, the desired controlled environment can be a fluid such as water. Alternatively, the desired controlled environment can be another type of fluid.

Figure 2A:
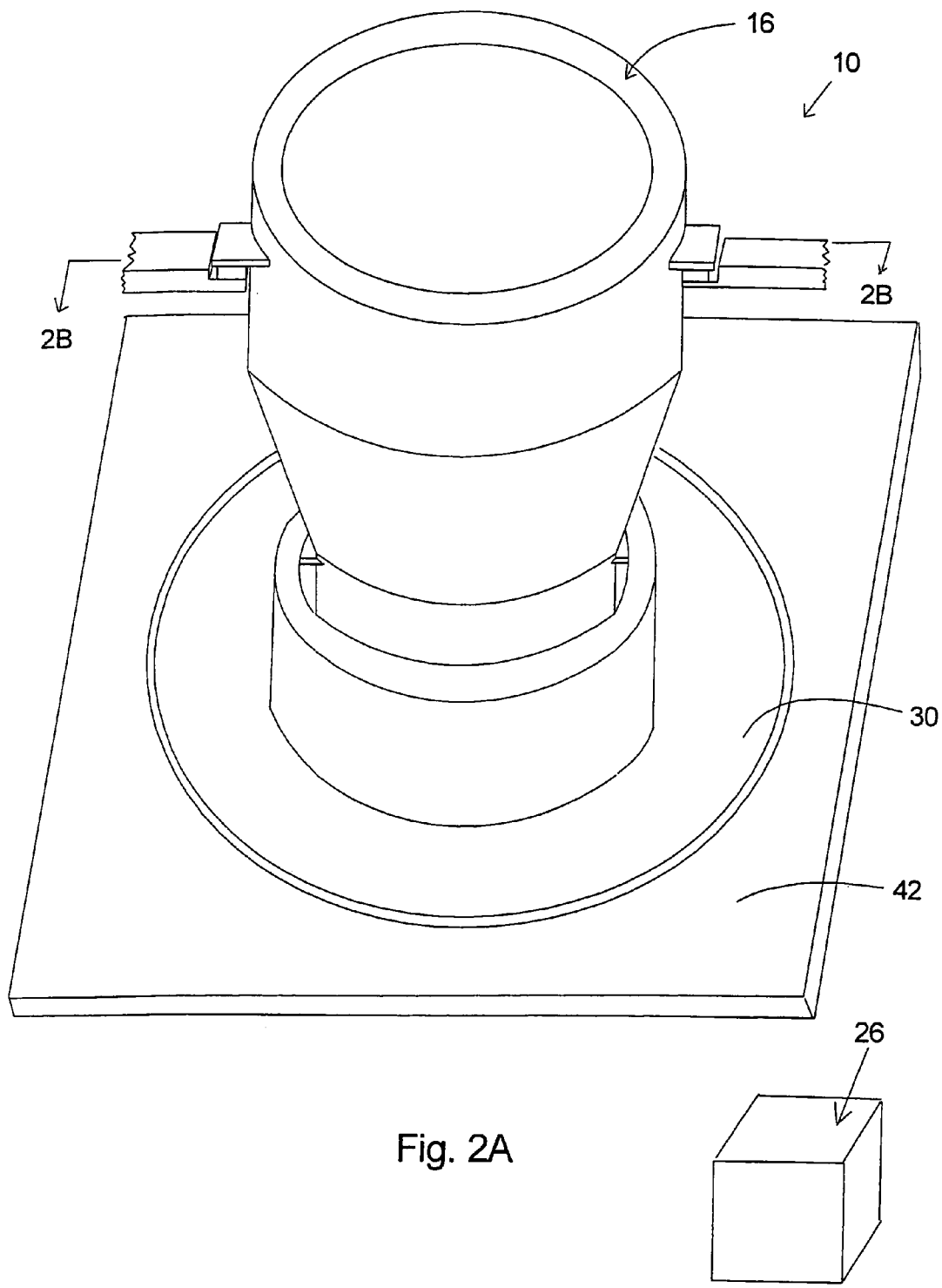
FIG. 2A is a perspective view of a portion of the exposure apparatus of FIG. 1.

FIG. 2A is a perspective view of the wafer 30, and a portion of the exposure apparatus 10 of FIG. 1 including the optical assembly 16, the device stage 42, and the environmental system 26.

Figure 2B:
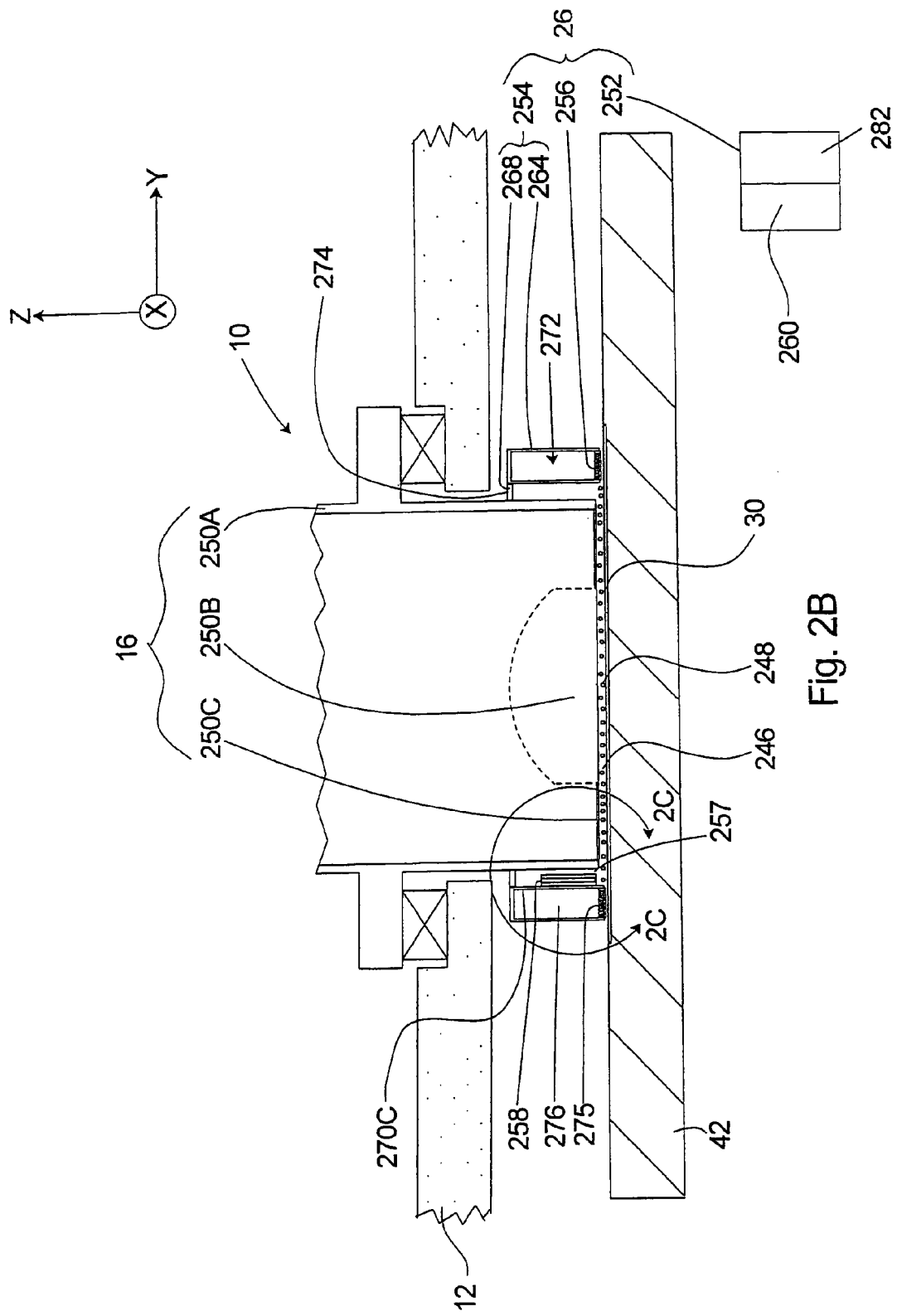
FIG. 2B is a cut-away view taken on line 2B-2B of FIG. 2A.

FIG. 2B is a cut-away view of the portion of the exposure apparatus 10 of FIG. 2A, including the optical assembly 16, the device stage 42, and the environmental system 26. FIG. 2B illustrates that the optical assembly 16 includes an optical housing 250A, a last optical element 250B, and an element retainer 250C that secures the last optical element 250B to the optical housing 250A. Additionally, FIG. 2B illustrates the gap 246 between the last optical element 250B and the wafer 30. In one embodiment, the gap 246 is approximately 1 mm.

In one embodiment, the environmental system 26 fills the imaging field and the rest of the gap 246 with an immersion fluid 248 (illustrated as circles). The design of the environmental system 26 and the components of the environmental system 26 can be varied. In the embodiment illustrated in FIG. 2B, the environmental system 26 includes an immersion fluid system 252, a fluid barrier 254, and a transport region 256. In this embodiment, (i) the immersion fluid system 252 delivers and/or injects the immersion fluid 248 into the gap 246, removes the immersion fluid 248 from or near the transport region 256, and/or facilitates the movement of the immersion fluid 248 through the transport region 256, (ii) the fluid barrier 254 inhibits the flow of the immersion fluid 248 away from near the gap 246, and (iii) the transport region 256 transfers and/or conveys the immersion fluid 248 flowing from the gap 246. The fluid barrier 254 also forms a chamber 257 near the gap 246.

The design of the immersion fluid system 252 can vary. For example, the immersion fluid system 252 can inject the immersion fluid 248 at one or more locations at or near the gap 246 and chamber 257, the edge of the optical assembly 16, and/or directly between the optical assembly 16 and the wafer 30. Further, the immersion fluid system 252 can assist in removing and/or scavenging the immersion fluid 248 at one or more locations at or near the device 30, the gap 246 and/or the edge of the optical assembly 16.

Figure 2C:
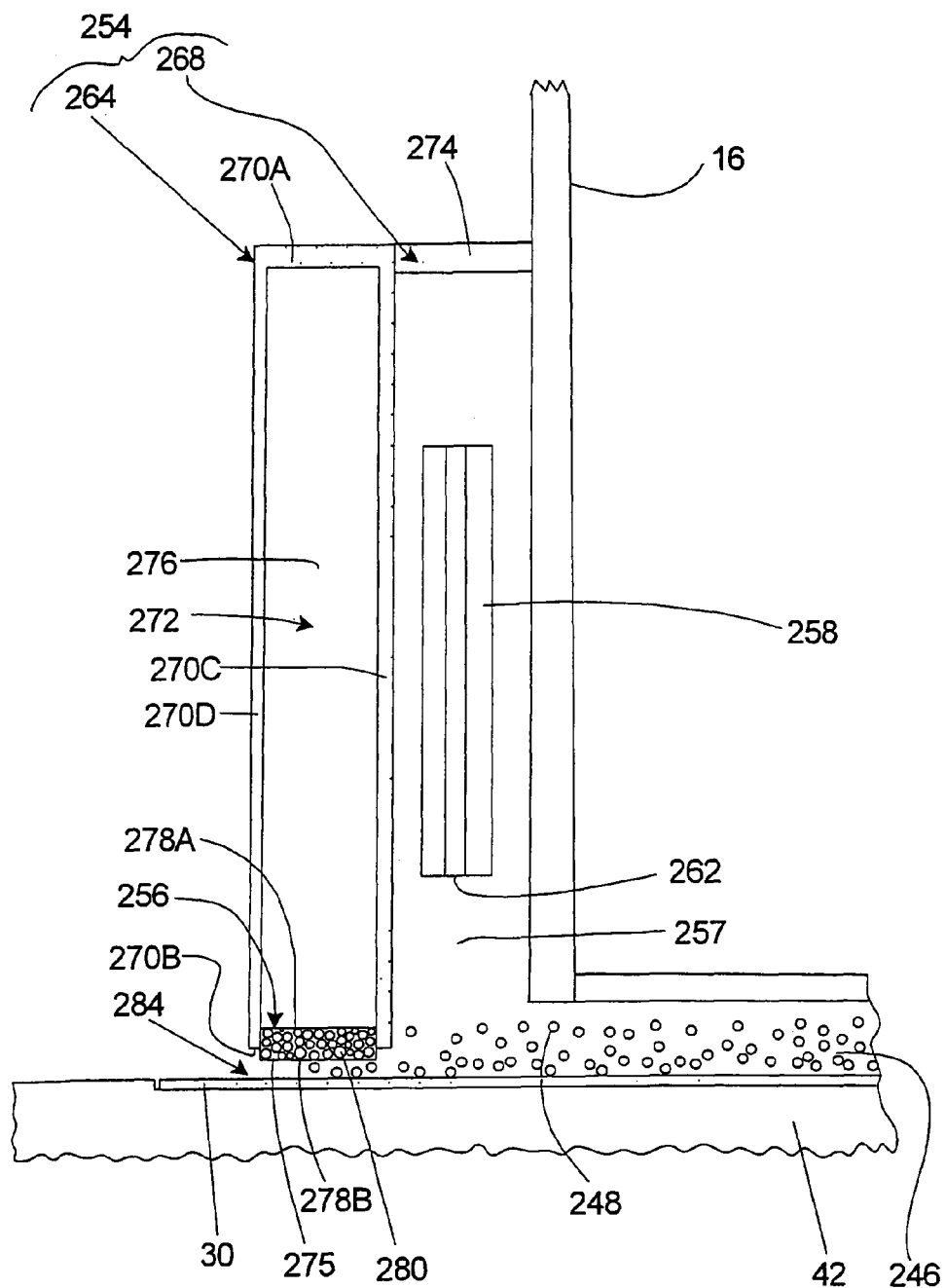
FIG. 2C is an enlarged detailed view taken on line 2C-2C in FIG. 2B.

In the embodiment illustrated in FIG. 2B, the immersion fluid system 252 includes one or more injector nozzles 258 (only one is illustrated) positioned near the perimeter of the optical assembly 16 and an immersion fluid source 260. FIG. 2C illustrates one injector nozzle 258 in more detail. In this embodiment, each of the injector nozzles 258 includes a nozzle outlet 262 that is in fluid communication with the immersion fluid source 260. At the appropriate time, the immersion fluid source 260 provides immersion fluid 248 to the one or more nozzle outlets 262 that is released into the chamber 257.

FIGS. 2B and 2C also illustrate that the immersion fluid 248 in the chamber 257 sits on top of the wafer 30. The immersion fluid 248 flows into the gap 246. Further, as the wafer 30 moves under the optical assembly 16, it will drag the immersion fluid 248 in the vicinity of the top surface of the wafer 30 with the wafer 30 into the gap 246.

In one embodiment, the fluid barrier 254 forms the chamber 257 around the gap 246, restricts the flow of the immersion fluid 248 from the gap 246, assists in maintaining the gap 246 full of the immersion fluid 248, and facilitates the recovery of the immersion fluid 248 that escapes from the gap 246. In one embodiment, the fluid barrier 254 encircles and is positioned entirely around the gap 246 and the bottom of the optical assembly 16. Further, in one embodiment, the fluid barrier 254 confines the immersion fluid 248 to a region on the wafer 30 and the device stage 42 centered on the optical assembly 16. Alternatively, for example, the fluid barrier 254 can be positioned around only a portion of the gap 246 or the fluid barrier 254 can be off-center of the optical assembly 16.

In the embodiment illustrated in FIGS. 2B and 2C, the fluid barrier 254 includes a containment frame 264, and a frame support 268. In this embodiment, the containment frame 264 is generally annular ring shaped and encircles the gap 246. Additionally, in this embodiment, the containment frame 264 includes a top side 270A, an opposed bottom side 270B that faces the wafer 30, an inner side 270C that faces the gap 246, and an outer side 270D. Moreover, in this embodiment, the fluid barrier 254 includes a channel 272 for receiving the transport region 256. As an example, the channel 272 can be annular shaped.

The terms top and bottom are used merely for convenience, and the orientation of the containment frame 264 can be rotated. It should also be noted that the containment frame 264 can have another shape. For example, the containment frame 264 can be rectangular frame shaped, octagonal frame shaped, oval frame shaped, or another suitable shape.

The frame support 268 connects and supports the containment frame 264 to the apparatus frame 12, another structure, and/or the optical assembly 16, above the wafer 30 and the device stage 42. In one embodiment, the frame support 268 supports all of the weight of the containment frame 264. Alternatively, for example, the frame support 268 can support only a portion of the weight of the containment frame 264. In one embodiment, the frame support 268 can include one or more support assemblies 274. For example, the frame support 268 can include three spaced apart support assemblies 274 (only two are illustrated in FIG. 2B). In this embodiment, each support assembly 274 extends between the optical assembly 16 and the inner side 270C of the containment frame 264.

In one embodiment, each support assembly 274 is a mount that rigidly secures the containment frame 264 to the optical assembly 16. Alternatively, for example, each support assembly can be a flexure that supports the containment frame 264 in a flexible fashion. As used herein, the term "flexure" shall mean a part that has relatively high stiffness. in some directions and relatively low stiffness in other directions. In one embodiment, the flexures cooperate (i) to be relatively stiff along the X axis and along the Y axis, and (ii) to be relatively flexible along the Z axis. In this embodiment, the flexures can allow for motion of the containment frame 264 along the Z axis and inhibit motion of the containment frame 264 along the X axis and the Y axis.

Alternatively, for example, each support assembly 274 can be an actuator that can be used to adjust the position of the containment frame 264 relative to the wafer 30 and the device stage 42. In this embodiment, the frame support 268 can also include a frame measurement system (not shown) that monitors the position of the containment frame 264. For example, the frame measurement system can monitor the position of the containment frame 264 along the Z axis, about the X axis, and/or about the Y axis. With this information, the support assemblies 274 can be used to adjust the position of the containment frame 264. In this embodiment, the support assemblies 274 can actively adjust the position of the containment frame 264.

FIGS. 2B and 2C also illustrate the transport region 256 in more detail. In this embodiment, the transport region 256 is a substrate 275 that is substantially annular disk shaped, encircles the gap 246, and is substantially concentric with the optical assembly 16. Alternatively, for example, the substrate 275 can be another shape, including oval frame shaped, rectangular frame shaped or octagonal frame shaped. Still alternatively, for example, the transport region 256 can include a plurality of substrate segments that cooperate to encircle a portion of the gap 246, and/or a plurality of substantially concentric substrates.

The dimensions of the transport region 256 can be selected to achieve the desired immersion fluid recovery rate.

Further, in this embodiment, the transport region 256 is secured to the containment frame 264 at or near the bottom side 270B of the containment frame 264 and cooperates with the containment frame 264 to form a removal chamber 276 next to and above the transport region 256. Moreover, as illustrated in FIG. 2C, the transport region 256 includes a first surface 278A that is adjacent to the removal chamber 276 and an opposite second surface 278B that is adjacent to the device 30 and the gap 246.

In this embodiment, the transport region 256 captures, retains, and/or absorbs at least a portion of the immersion fluid 248 that flows between the containment frame 264 and the wafer 30 and/or the device stage 42. The type of material utilized in the transport region 256 can vary. In one embodiment, the substrate 275 includes a plurality of passages 280. For example, the passages 280 can be relatively small and tightly packed.

As an example, the transport region 256 can be a porous material having a plurality of pores and/or interstices that convey the immersion fluid 248 by capillary action. In this embodiment, the passages 280 can be small enough so that capillary forces draw the immersion fluid 248 into the pores. Examples of suitable materials include wick type structures made of metals, glasses, or ceramics'. Examples of suitable wick type structures include any material with a network of interconnected, small passages, including, but not limited to, woven fiberglass, sintered metal powders, screens, wire meshes, or grooves in any material. The transport region 256 can be hydrophilic.

In one embodiment, the transport region 256 has a pore size of between approximately 20 and 200 microns. In alternative embodiments, the transport region 256 can have a porosity of at least approximately 40, 80, 100, 140, 160 or 180.

In certain embodiments, a relatively higher flow capacity is required. To accommodate higher flow, larger porosity material may be necessary for the transport region 256. The choice for the porosity of the transport region 256 depends on the overall flow rate requirement of the transport region 256. Larger overall flow rates can be achieved by using a transport region 256 having a larger porosity, decreasing the thickness of the transport region 256, or increasing the surface area of the transport region 256. In one embodiment, with a flow rate requirement of 0.3-1.0 L/min in immersion lithography, pores size of 40-150 μm can be used to cover a 30-150 cm$^2$ area for immersion fluid 248 recovery. The type and specifications of the porous material also depends on the application and the properties of the immersion fluid 248.

Referring back to FIG. 2B, in certain embodiments, the transport region 256 has a limited capacity to absorb the immersion fluid 248. In one embodiment, the immersion fluid system 252 includes a fluid removal system 282 that removes immersion fluid 248 from or near the transport region 256 and that is in fluid communication with the transport region 256 and the removal chamber 276. With this design, the immersion fluid 248 can be captured with the transport region 256 and removed by the fluid removal system 276.

In one embodiment, the fluid removal system 282 removes the immersion fluid 248 from the top first surface 278A of the transport region 256 allowing additional immersion fluid 248 to flow into the bottom, second surface 278B of the transport region 256. For example, the fluid removal system 282 can create a pressure differential across the transport region 256. In one example, the fluid removal system 282 causes the pressure at the first surface 278A to be lower than the pressure at the second surface 278B.

The removal of the immersion fluid 248 can be accomplished in several different ways and a number of embodiments of the fluid removal system 282 are described below.

FIG. 2C illustrates that a frame gap 284 exists between (i) the bottom side 270B of the containment frame 264 and the second surface 278B of the transport region 256, and (ii) the wafer 30 and/or the device stage 42 to allow for ease of movement of the device stage 42 and the wafer 30 relative to the containment frame 264. The size of the frame gap 284 can vary. In one embodiment, the frame gap 284 is between approximately 0.1 and 2 mm. In alternative examples, the frame gap 284 can be approximately 0.05, 0.1, 0.2, 0.5, 1, 1.5, 2, 3, or 5 mm.

With this embodiment, most of the immersion fluid 248 is confined within the fluid barrier 254 and most of the leakage around the periphery is scavenged within the narrow frame gap 284 by the transport region 256. In this case, when the immersion fluid 248 touches the transport region 256, it is drawn into the transport region 256 and absorbed. Thus, the transport region 256 inhibits any immersion fluid 248 from flowing outside the ring.

Figure 2D:
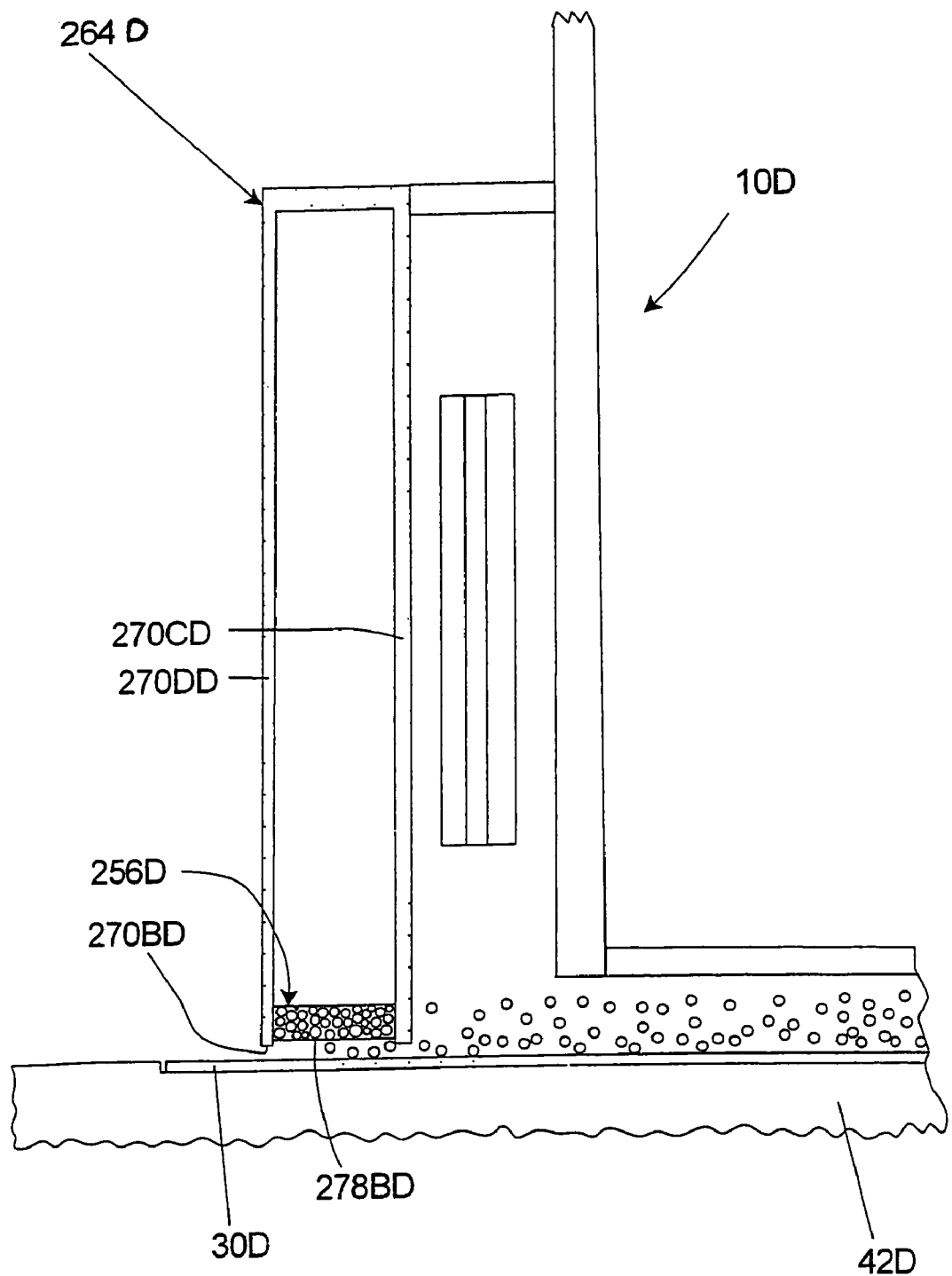
FIG. 2D is an enlarged detailed view of another embodiment of a portion of an exposure apparatus.

FIG. 2D illustrates a cut-away view of a portion of another embodiment of an exposure apparatus 10D that is somewhat similar to the embodiment illustrated in FIG. 2C. However, in FIG. 2D, the device 30D and/or the stage 42D is closer to the bottom side 270BD of the inner side 270CD and/or the outer side 270DD of the containment frame 264D than the second surface 278DB of the transport region 256D. Stated another way, the distance between the bottom side 270BD and the device 30D and/or the stage 42D is less than the distance between the second surface 278DB and the device 30D and/or the stage 42D.

Figure 3A:
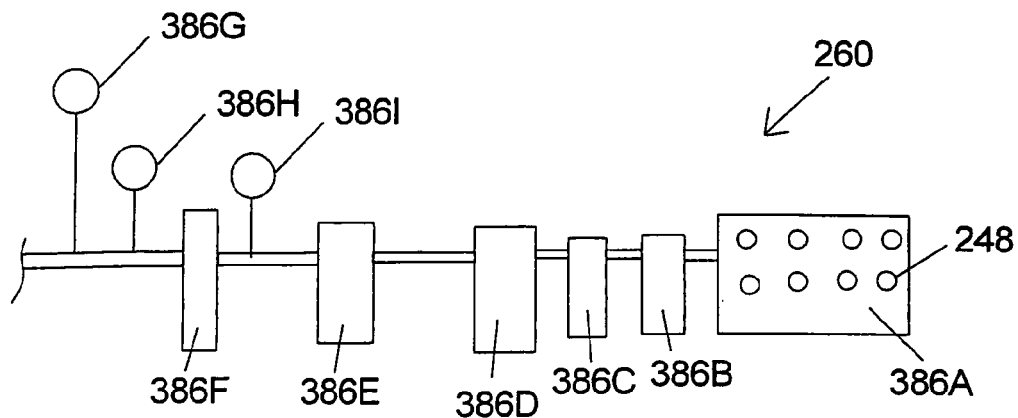
FIG. 3A is a side illustration: of an immersion fluid source having features of the invention.

FIG. 3A illustrates one embodiment of the immersion fluid source 260. In this embodiment, the immersion fluid source 260 includes (i) a fluid reservoir 386A that retains the immersion fluid 248, (ii) a filter 386B in fluid communication with the fluid reservoir 386A that filters the immersion fluid 248, (iii) a de-aerator 386C in fluid communication with the filter 386B that removes any air, contaminants, or gas from the immersion fluid 248, (iv) a temperature controller 386D, e.g., a heat exchanger or chiller, in fluid communication with the de-aerator 386C that controls the temperature of the immersion fluid 248, (v) a pressure source 386E, e.g., a pump, in fluid communication with the temperature controller 386D, and (vi) a flow controller 386F that has an inlet in fluid communication with the pressure source 386E and an outlet in fluid communication with the nozzle outlets 262 (illustrated in FIG. 2C), the flow controller 386F controlling the pressure and flow to the nozzle outlets 262.

Additionally, the immersion fluid source 260 can include (i) a pressure sensor 386G that measures the pressure of the immersion fluid 248 that is delivered to the nozzle outlets 262, (ii) a flow sensor 386H that measures the rate of flow of the immersion fluid 248 to the nozzle outlets 262, and (iii) a temperature sensor 386I that measures the temperature of the immersion fluid 248 to the nozzle outlets 262. The operation of these components can be controlled by the control system 24 (illustrated in FIG. 1) to control the flow rate, temperature and/or pressure of the immersion fluid 248 to the nozzle outlets 262. The information from these sensors 386G-386I can be transferred to the control system 24 so that the control system 24 can appropriately adjust the other components of the immersion fluid source 260 to achieve the desired temperature, flow and/or pressure of the immersion fluid 248.

The orientation of the components of the immersion fluid source 260 can be varied. Further, one or more of the components may not be necessary and/or some of the components can be duplicated. For example, the immersion fluid source 260 can include multiple pumps, multiple reservoirs, temperature controllers or other components. Moreover, the environmental system 26 can include multiple immersion fluid sources 260.

The rate at which the immersion fluid 248 is pumped into the gap 246 (illustrated in FIG. 2B) can vary. In one embodiment, the immersion fluid 248 is supplied to the gap 246 via the nozzle outlets 262 at a rate of between approximately 0.5 liters/min to 2 liters/min. However, the rate can be greater or less than these amounts.

The type of immersion fluid 248 can be varied to suit the design requirements of the apparatus 10. In one embodiment, the immersion fluid 248 is a fluid such as de-gassed, de-ionized water. Alternatively, for example, the immersion fluid 248 can be another type of fluid, such as a per-fluorinated polyether (PFPE) such as Fomblin oil.

Figure 3D:
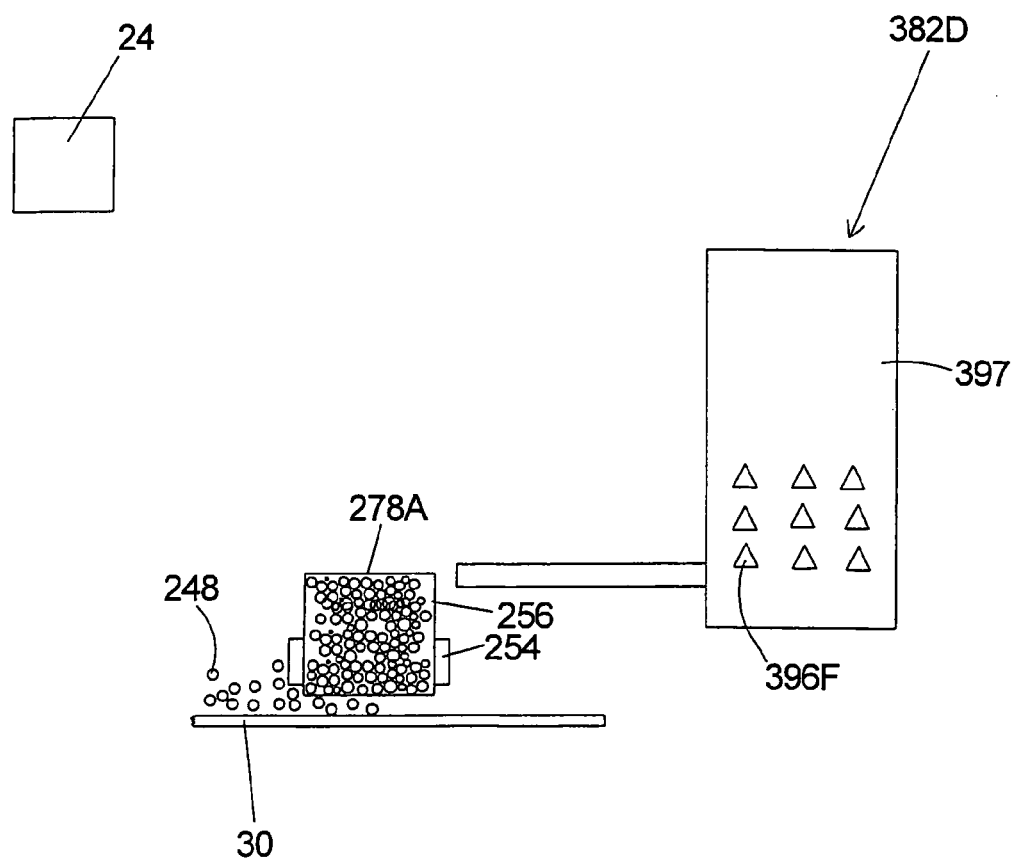
FIG. 3D is a side illustration of another embodiment of a fluid removal system having features of the invention.
Figure 3B:
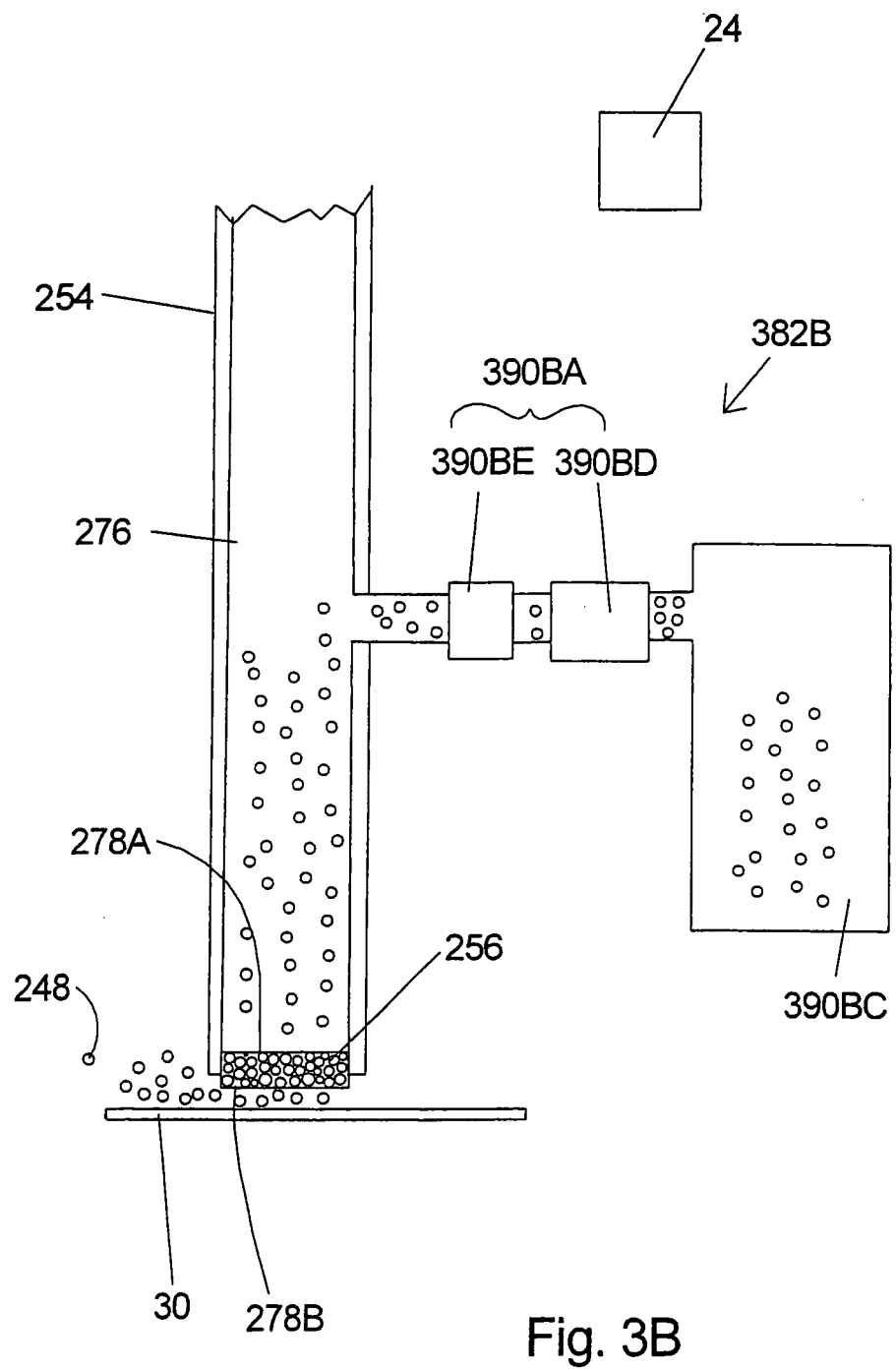
FIG. 3B is a side illustration of a fluid removal system having features of the invention.

FIG. 3B illustrates a first embodiment of the fluid removal system 382B and an illustration of a portion of the fluid barrier 254, the transport region 256, the wafer 30, and the immersion fluid 248. The fluid removal system 382B is also referred to herein as a pressure system. In one embodiment, the fluid removal system 382B creates and/or applies a transport pressure to the first surface 278A of the transport region 256. In this embodiment, the fluid removal system 382B maintains the transport pressure at the first surface 278A of the transport region 256 so that a pressure differential exists between the first surface 278A and the second surface 278B. In alternative embodiments, the fluid removal system 382B controls the pressure in the removal chamber 276 so that the transport pressure at the first surface 278A is approximately −10, −100, −500, −1000, −2000, −5000, −7000 or −10,000 Pa gage.

In FIG. 3B, the fluid removal system 382B includes (i) a low pressure source 390BA that creates a low chamber pressure in the removal chamber 276, and (ii) a recovery reservoir 390BC that captures immersion fluid 248 from the removal chamber 276. In this embodiment, the low pressure source 390BA can include a pump or vacuum source 390BD, and a chamber pressure regulator 390BE for precisely controlling the chamber pressure in the chamber 276. In alternative embodiments, for example, the chamber pressure is controlled to be approximately −10, −100, −500, −1000, −2000, −5000, −7000 or −10,000 Pa gage. The chamber pressure regulator 390BE can be controlled by the control system 24 to control the chamber pressure.

Figure 3C:
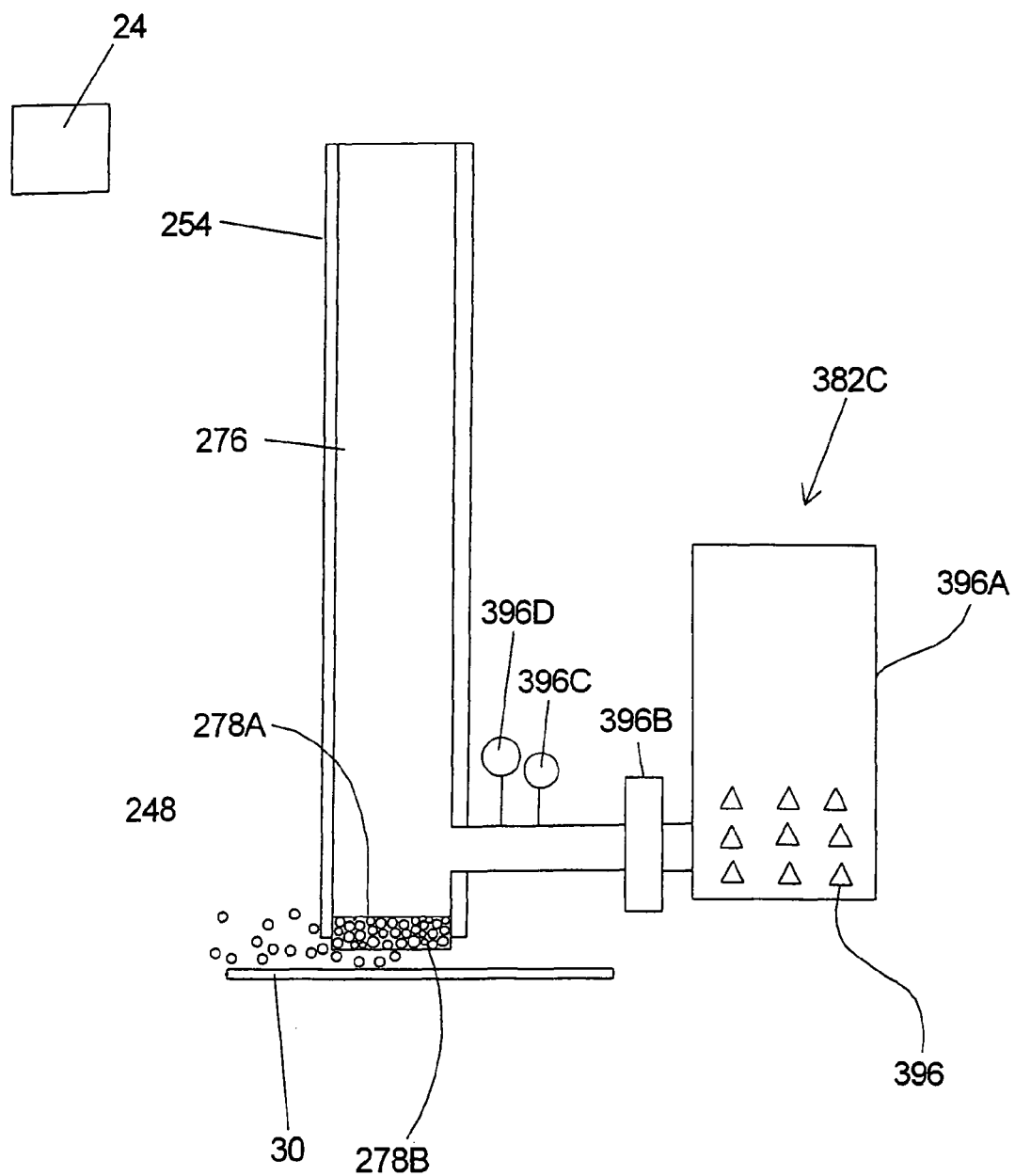
FIG. 3C is a side illustration of another embodiment of a fluid removal system having features of the invention.

FIG. 3C illustrates another embodiment of the fluid removal system 382C and an illustration of a portion of the fluid barrier 254, the transport region 256, the wafer 30, and the immersion fluid 248. In this embodiment, the fluid removal system 382C forces a dry removal fluid 396 (illustrated as triangles), e.g., air through the removal chamber 276 and across the top first surface 278A of the transport region 256. The removal fluid 396 will dry the top surface 278A of the transport region 256, pumping immersion fluid 248 out of the transport region 256. The removal fluid 396 can be heated in some cases, improving the flow of the immersion fluid 248 into the dry removal fluid 396. Stated another way, in one embodiment, the removal fluid 396 is at a removal fluid temperature that is higher than an immersion fluid temperature of the immersion fluid 248.

In FIG. 3C, the fluid removal system 382C includes (i) a fluid source 396A of the pressurized drying removal fluid 396, (ii) a temperature controller 396B that controls the temperature of the drying removal fluid 396, (iii) a flow sensor 396C that measures the flow of the drying removal fluid 396, and (iv) a temperature sensor 396D that measures the temperature of the drying removal fluid 396. The fluid source 396A can include a pump controlled by the control system 24, and the temperature controller 396B can be a heater that is controlled by the control system 24.

FIG. 3D illustrates yet another embodiment of the fluid removal system 382D and an illustration of a portion of the fluid barrier 254, the transport region 256, the wafer 30, and the immersion fluid 248. In this embodiment, the transport region 256 is extended outside the fluid barrier 254. Further, the fluid removal system 382C includes a heat source 397 that directs a heated fluid 396F (illustrated as triangles) at the first surface 278A of the transport region 256, causing the immersion fluid 248 to boil out of the transport region 256 and be captured.

The orientation of the components of the fluid removal systems 382B-382D illustrated in FIGS. 3B-3D can be varied. Further, one or more of the components may not be necessary and/or some of the components can be duplicated. For example, each of the fluid removal systems 382B, 382C, 382D can include multiple pumps, multiple reservoirs, valves, or other components. Moreover, the environmental system 26 can include multiple fluid removal systems 382B, 382C, 382D.

Figure 4:
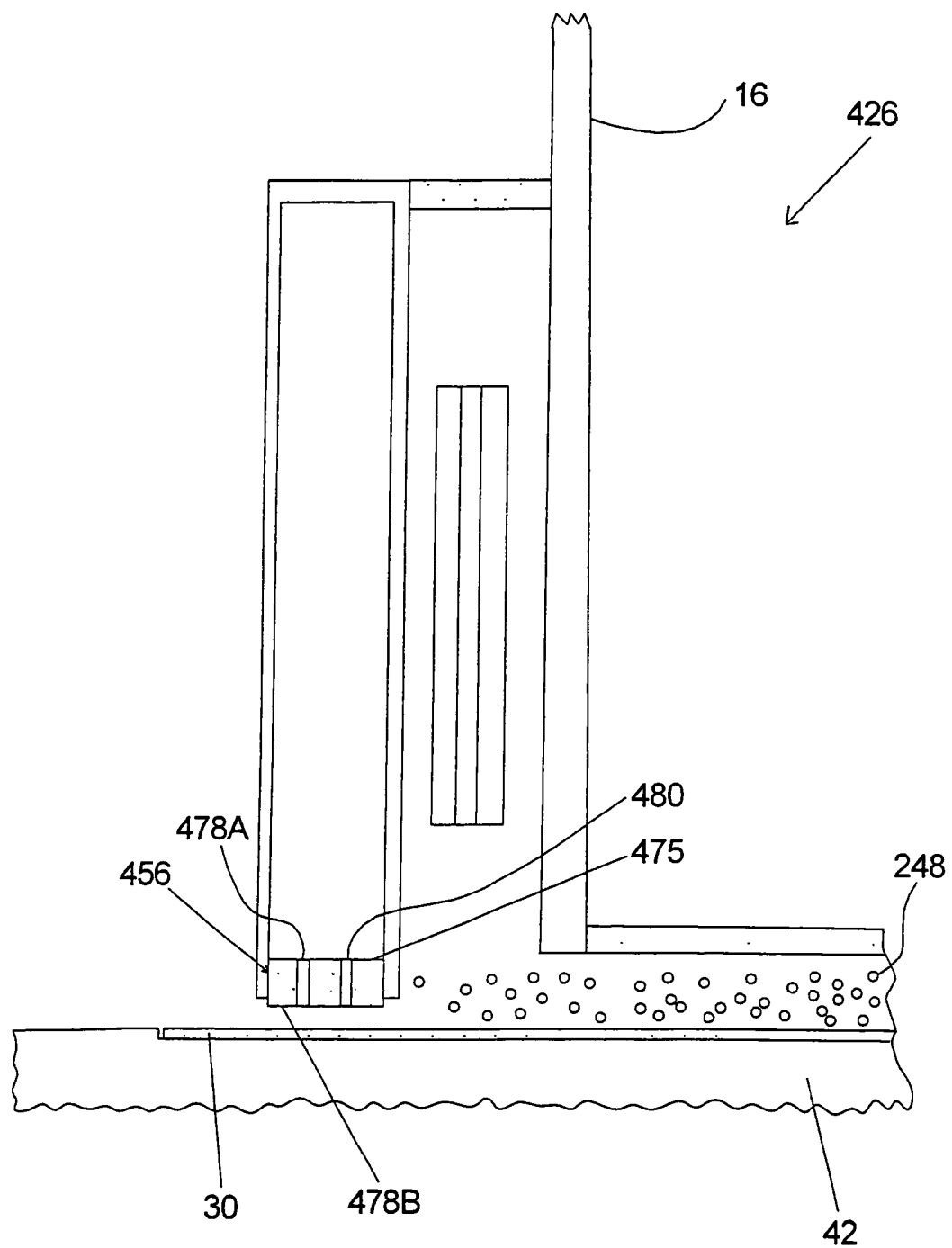
FIG. 4 is an enlarged cut-away view of a portion of another embodiment of an exposure apparatus.

FIG. 4 is an enlarged view of a portion of another embodiment of the environmental system 426, a portion of the wafer 30, and a portion of the device stage 42. In this embodiment, the environmental system 426 is somewhat similar to the corresponding component described above and illustrated in FIGS. 2A-2C. However, in this embodiment, the transport region 456 is slightly different. In particular, in this embodiment, the passages 480 (only two are illustrated) in the substrate 475 of the transport region 456 are a plurality of spaced apart transport apertures that extend substantially transversely through the substrate 475 between the first surface 478A and the second surface 478B.

In this embodiment, for example, the substrate 475 can be made of a material such as glass or other hydrophilic materials. In one embodiment, the transport apertures 480 can have a diameter of between approximately 0.1 and 0.2 mm. However, in certain embodiments, the transport apertures can be larger or smaller than these amounts.

With this design, for example, one or more of the fluid removal systems 382B, 382C (illustrated in FIGS. 3B and 3C) can be used to apply a vacuum or partial vacuum on the transport apertures 480. The partial vacuum draws the immersion fluid 248 through the transport region 456.

Figure 5A:
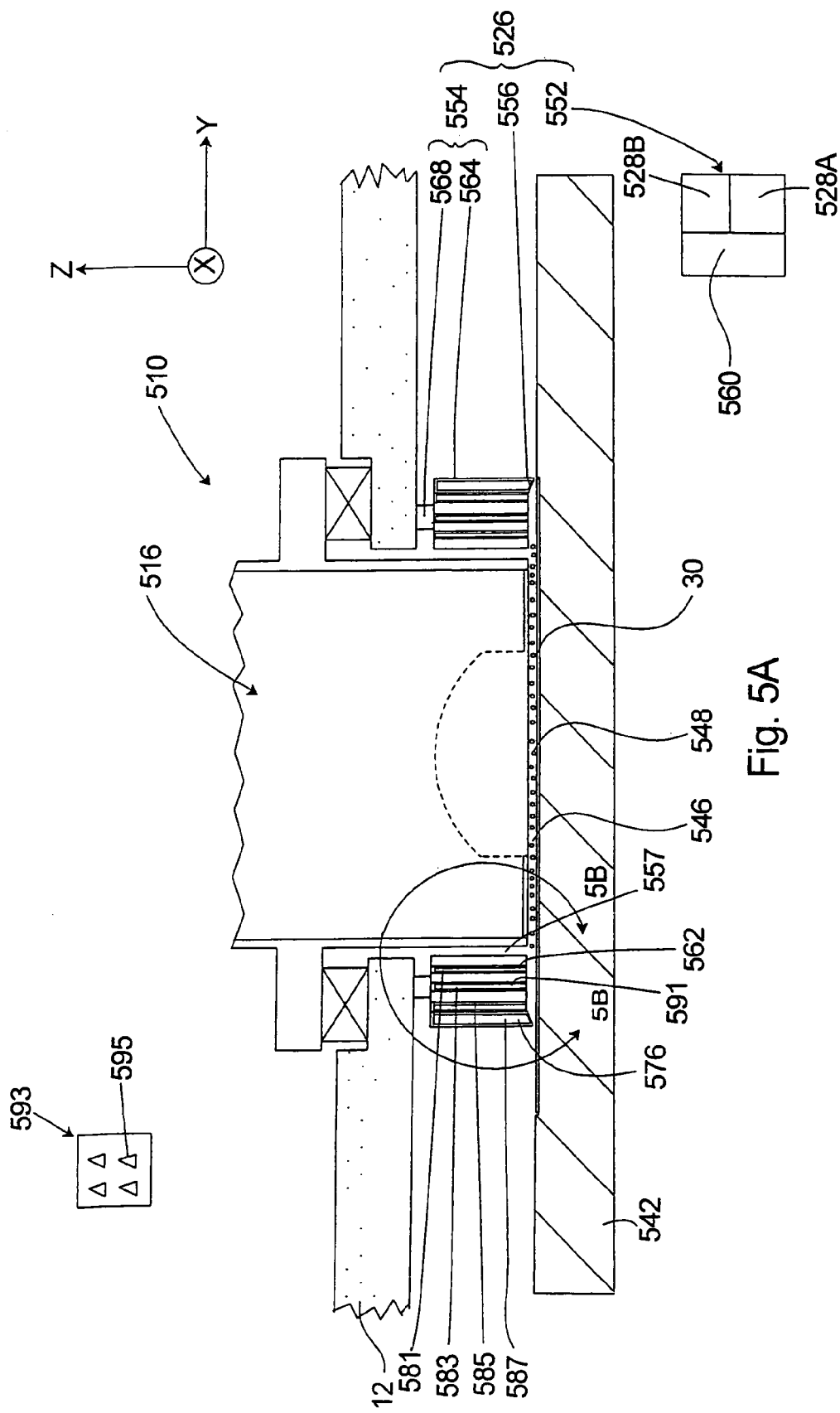
FIG. 5A is an enlarged cut-away view of a portion of another embodiment of an exposure apparatus.
Figure 5B:
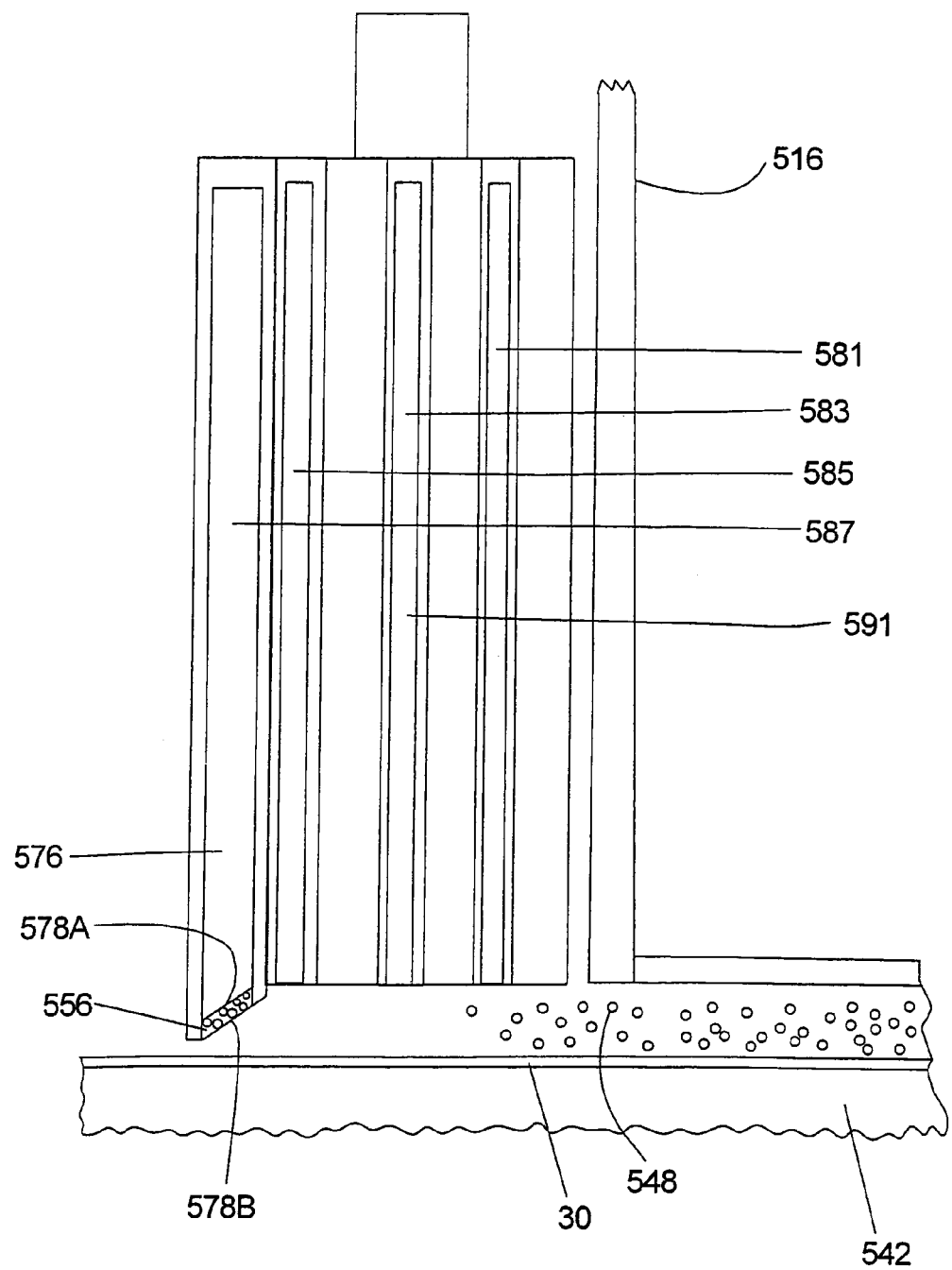
FIG. 5B is an enlarged detailed view taken on line 5B-5B in FIG. 5A.

FIG. 5A is a cut-away view of a portion of another embodiment of the exposure apparatus 510, including the optical assembly 516, the device stage 542, and the environmental system 526. FIG. 5A also illustrates the wafer 30, the gap 546, and that the immersion fluid 548 fills the gap 546. FIG. 5B illustrates an enlarged portion of FIG. 5A taken on line 5B-5B.

In this embodiment, the environmental system 526 again includes an immersion fluid system 552, a fluid barrier 554, and a transport region 556 that are somewhat similar to the corresponding components described above. In this embodiment, the fluid barrier 554 includes a containment frame 564 that forms a chamber 557 around the gap 546, and a frame support 568 that connects and supports the containment frame 564 to the apparatus frame 12. However, in this embodiment, the containment frame 564 includes (i) an annular shaped first channel 581 that defines a nozzle outlet 562 that is in fluid communication with an immersion fluid source 560 of the immersion fluid system 552; (ii) an annular shaped second channel 583, (iii) an annular shaped third channel 585, and (iv) an annular shaped fourth channel 587 for receiving the transport region 556. In this embodiment, the channels 581, 583, 585, 587 are approximately concentric and are centered about the optical assembly 516. Further, in this embodiment, the second channel 583 encircles the first channel 581, the third channel 585 encircles the second channel 583, and the fourth channel 587 encircles the third channel 585. However, the shape, orientation, and/or position of the channels 581, 583, 585, 587 can be changed.

In one embodiment, the immersion fluid system 552 provides the immersion fluid 548 to the first channel 581 and the nozzle outlet 562 that is released into the chamber 557. The transport region 556 cooperates with the containment frame 564 to form a removal chamber 576 next to and above the transport region 556. Moreover, the transport region 556 includes a first surface 578A that is adjacent to the removal chamber 576 and an opposite second surface 578B that is adjacent to the device 30 and the gap 546.

In this embodiment, the third channel 585 is in fluid communication with a first removal system 528A. In one embodiment, the first removal system 528A creates a vacuum or partial vacuum in the third channel 585 that pulls and/or draws the immersion fluid 548 into the third channel 585. For example, in alternative embodiments, the first removal system 528A can maintain the pressure in the third channel 585 at approximately −10, −100, −500, −1000, −2000, −5000, −7000 or −10,000 Pa gage.

Further, in this embodiment, the fourth channel 587 is in fluid communication with a second removal system 528B. In this embodiment, the second removal system 528B removes the immersion fluid 548 from the top first surface 578A of the transport region 556, allowing additional immersion fluid 548 to flow into the bottom, second surface 578B of the transport region 556.

In one embodiment, the design of the first removal system 528A can be somewhat similar to the design of one of the removal systems 382B, 382C illustrated in FIGS. 3B-3D and/or the design of the second removal system 528B can be somewhat similar to one of the designs illustrated in FIGS. 3B-3D.

In one embodiment, the majority of the immersion fluid 548 exiting from the gap 546 is recovered through the third channel 585. For example, the third channel 585 can recover between approximately 80-90 percent of the immersion fluid 548 recovered from the gap 546. In alternative embodiments, the third channel 585 can recover at least approximately 50, 60, 70, 80, or 90 percent of the immersion fluid 548 recovered from the gap 546. With this design, the fourth channel 587 can be used to capture the immersion fluid 548 not captured by the third channel 585.

Additionally, in one embodiment, the environmental system 526 includes a pressure controller 591 that can be used to control the pressure in the gap 546. In one embodiment, the pressure controller 591 can cause the pressure in the gap 546 to be approximately equal to the pressure outside of the gap 546. For example, in one embodiment, the second channel 583 defines the pressure controller 591. In this embodiment, the second channel 583 is open to the atmospheric pressure and is positioned inside the periphery of third channel 585. With this design, the negative pressure (vacuum or partial vacuum) in the third channel 585 will not strongly influence the pressure between the optical assembly 516 and the wafer 30.

Alternatively, for example, a control pressure source 593 can deliver a control fluid 595 (illustrated as triangles) to the second channel 583 that is released into the gap 546. In one embodiment, the control fluid 595 can be a gas that is not easily absorbed by the immersion fluid 548. For example, if the immersion fluid 548 is water, the control fluid 595 can be water. If the immersion fluid 548 does not absorb the control fluid 595 or otherwise react to it, the chances of bubble formation on the surface of the wafer 30 can be reduced.

In yet another embodiment, the environmental system 526 can include a device for creating a fluid bearing (not shown) between the containment frame 564 and the wafer 30 and/or the device stage 542. For example, the containment frame 564 can include one or more bearing outlets (not shown) that are in fluid communication with a bearing fluid source (not shown) of a bearing fluid (not shown). In this embodiment, the bearing fluid source provides pressurized fluid to the bearing outlet to create the aerostatic bearing. The fluid bearings can support all or a portion of the weight of the containment frame 564.

It should be noted that in each embodiment, additional transport regions can be added as necessary.

Figure 6A:
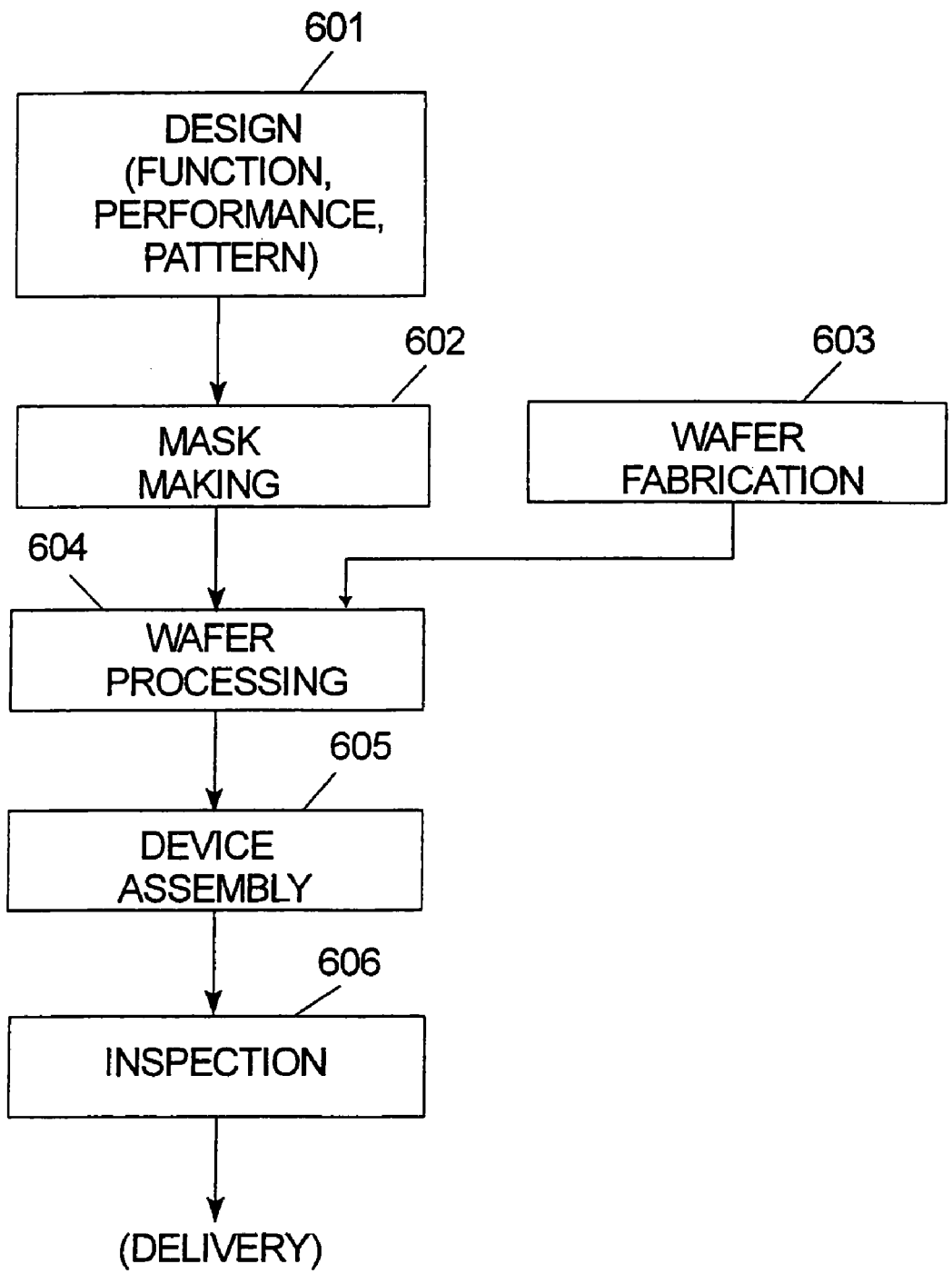
FIG. 6A is a flow chart that outlines a process for manufacturing a device in accordance with the invention.

Semiconductor devices can be fabricated using the above described systems, by the process shown generally in FIG. 6A. In step 601 the device's function and performance characteristics are designed. Next, in step 602, a mask (reticle) having a pattern is designed according to the previous designing step, and in a parallel step 603 a wafer is made from a silicon material. The mask pattern designed in step 602 is exposed onto the wafer from step 603 in step 604 by a photolithography system described hereinabove in accordance with the invention. In step 605 the semiconductor device is assembled (including the dicing process, bonding process and packaging process). Finally, the device is then inspected in step 606.

Figure 6B:
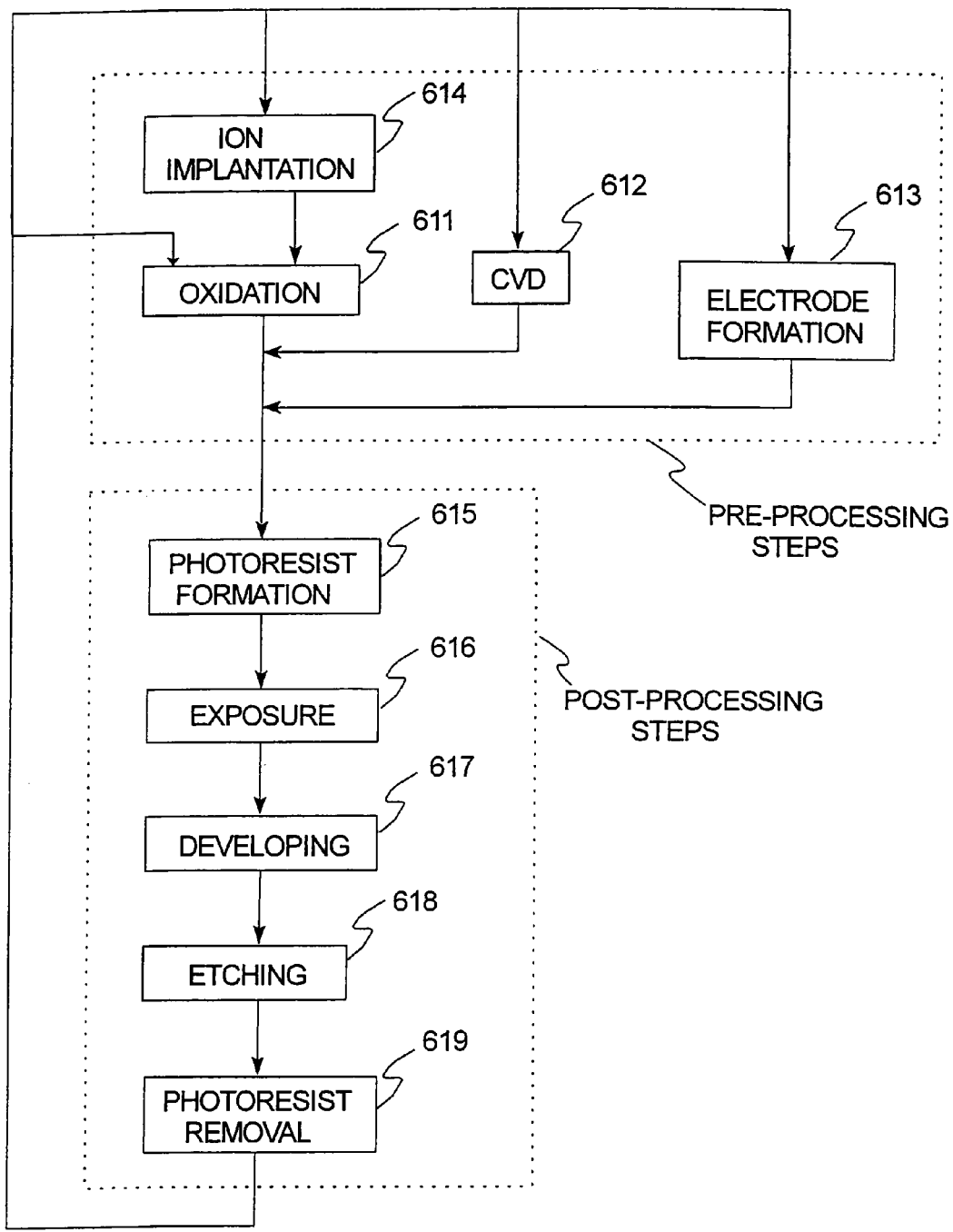
FIG. 6B is a flow chart that outlines device processing in more detail.

FIG. 6B illustrates a detailed flowchart example of the above-mentioned step 604 in the case of fabricating semiconductor devices. In FIG. 6B, in step 611 (oxidation step), the wafer surface is oxidized. In step 612 (CVD step), an insulation film is formed on the wafer surface. In step 613 (electrode formation step), electrodes are formed on the wafer by vapor deposition. In step 614 (ion implantation step), ions are implanted in the wafer. The above mentioned steps 611-614 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 615 (photoresist formation step), photoresist is applied to a wafer. Next, in step 616 (exposure step), the above-mentioned exposure device is used to transfer the circuit pattern of a mask (reticle) to a wafer. Then in step 617 (developing step), the exposed wafer is developed, and in step 618 (etching step), parts other than residual photoresist (exposed material surface) are removed by etching. In step 619 (photoresist removal step), unnecessary photoresist remaining after etching is removed.

Multiple circuit patterns are formed by repetition of these preprocessing and post-processing steps.

While the particular exposure apparatus 10 as shown and described herein is fully capable of obtaining the objects and providing the advantages previously stated, it is to be understood that it is merely illustrative of embodiments of the invention. No limitations are intended to the details of construction or design herein shown.

What is claimed is:

1. A method of making a device for a liquid immersion lithography apparatus in which a wafer is exposed through a liquid filled in a space between an optical member and the wafer, the method comprising:
   providing a member configured to surround the optical member; and
   attaching a passage-forming member having a plurality of passages that generate a capillary force to the member configured to surround the optical member, such that the passage-forming member surrounds the optical member, through which the liquid is collected from a gap between the passage-forming member and a surface of the wafer opposite to the passage-forming member.

2. The method according to claim 1, wherein the member configured to surround the optical member has an inner space, and the passage-forming member has a first end facing the inner space, a second end opposite to the first end, and wherein the plurality of passages are formed between the first end and the second end in which the collected liquid flows from the second end toward the first end.

3. The method according to claim 2, wherein the liquid which exists in the gap between the second end of the passage-forming member and the surface of the wafer facing the second end is collected through the passage-forming member.

4. The method according to claim 2, further comprising providing a pressure adjusting system that controls a pressure in the inner space so that the collected liquid flows in the passages of the passage-forming member from the second end toward the first end.

5. The method according to claim 4, wherein the pressure adjusting system creates a pressure differential between the first end and the second end of the passage-forming member so that the collected liquid flows in the passages of the passage-forming member from the second end toward the first end.

6. The method according to claim 4, wherein the member is movable relative to the optical member.

7. The method according to claim 1, wherein the member configured to surround the optical member is attached to the optical member or attached to another part which is attached to a lens.

8. The method according to claim 7, wherein the member configured to surround the optical member is flexibly attached to the optical member.

9. The method according to claim 1, wherein the passage-forming member is attached on a bottom surface of the member configured to surround the optical member.

10. The method according to claim 1, wherein the member configured to surround the optical member is configured to be floating on the wafer.

11. The method according to claim 1, wherein the liquid moving away from the optical member is collected through the passage-forming member.

12. The method according to claim 1, wherein the passages of the passage forming-member include a network of interconnected passages.

13. A method used in a liquid immersion lithography apparatus, the method comprising:
   placing a wafer to be exposed under an optical member with a space therebetween which is filled with a liquid; and
   collecting a liquid from a gap between a passage-forming member of a member configured to surround the optical member and a surface of the wafer opposite to the passage-forming member, wherein the passage-forming member has a plurality of passages that generate capillary force and the passage-forming member is configured to surround the optical member.

14. The method according to claim 13, wherein the member configured to surround the optical member has an inner space, and wherein the passage-forming member has a first end facing the inner space, a second end opposite to the first end, and wherein the plurality of passages are formed between the first end and the second end in which the collected liquid flows from the second end toward the first end.

15. The method according to claim 14, wherein the liquid which exists in the gap between the second end of the passage-forming member and the surface of the wafer facing the second end is collected through the passage-forming member.

16. The method according to claim 14, further comprising adjusting a pressure in the inner space so that the collected liquid flows in the passages of the passage-forming member from the second end toward the first end.

17. The method according to claim 16, wherein a pressure differential is created between the first end and the second end of the passage-forming member.

18. The method according to claim 13, wherein the member configured to surround the optical member is attached to the optical member or attached to another part which is attached to a lens.

19. The method according to claim 18, wherein the member configured to surround the optical member is flexibly attached to the optical member.

20. The method according to claim 13, wherein the passage-forming member is attached on a bottom surface of the member configured to surround the optical member.

21. The method according to claim 13, wherein the member configured to surround the optical member is configured to be floating on the wafer.

22. The method according to claim 13, wherein the liquid moving away from the optical member is collected through the passage-forming member.

23. The method according to claim 13, wherein the passages of the passage-forming member include a network of interconnected passages.

* * * * *